(12) United States Patent
Chang

(10) Patent No.: US 12,125,761 B2
(45) Date of Patent: Oct. 22, 2024

(54) SEMICONDUCTOR PACKAGE INCLUDING PACKAGE SEAL RING AND METHODS FOR FORMING THE SAME

(71) Applicant: Taiwan Semiconductor Manufacturing Company Limited, Hsinchu (TW)

(72) Inventor: Jen-Yuan Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 497 days.

(21) Appl. No.: 17/467,658

(22) Filed: Sep. 7, 2021

(65) Prior Publication Data

US 2022/0262695 A1 Aug. 18, 2022

Related U.S. Application Data

(60) Provisional application No. 63/150,136, filed on Feb. 17, 2021.

(51) Int. Cl.
| | |
|---|---|
| *H01L 23/16* | (2006.01) |
| *H01L 21/56* | (2006.01) |
| *H01L 23/00* | (2006.01) |
| *H01L 23/31* | (2006.01) |
| *H01L 23/48* | (2006.01) |
| *H01L 23/538* | (2006.01) |
| *H01L 25/065* | (2023.01) |
| *H01L 27/06* | (2006.01) |

(52) U.S. Cl.
CPC ........ *H01L 23/3128* (2013.01); *H01L 21/568* (2013.01); *H01L 23/16* (2013.01); *H01L 23/481* (2013.01); *H01L 23/5389* (2013.01); *H01L 24/32* (2013.01); *H01L 24/83* (2013.01); *H01L 25/0657* (2013.01); *H01L 27/0688* (2013.01); *H01L 2224/32146* (2013.01); *H01L 2224/32233* (2013.01); *H01L 2224/83005* (2013.01)

(58) Field of Classification Search
None
See application file for complete search history.

(56) References Cited

U.S. PATENT DOCUMENTS

| | | | | |
|---|---|---|---|---|
| 10,157,892 | B1* | 12/2018 | Chen | H01L 21/6835 |
| 10,290,559 | B2* | 5/2019 | Lin | H01L 21/76877 |
| 11,088,041 | B2* | 8/2021 | Chen | H01L 25/0655 |
| 2021/0082779 | A1* | 3/2021 | Chen | H01L 23/5385 |

FOREIGN PATENT DOCUMENTS

TW    I528511 B    4/2016

OTHER PUBLICATIONS

Taiwan Patent and Trademark Office, Application No. 111103184; Office Action, mailed Nov. 29, 2022, 6 pages.
Taiwan Patent and Trademark Office, Application No. 111103184; Search Report, mailed Nov. 29, 2022, 1 page.

* cited by examiner

*Primary Examiner* — Telly D Green
(74) *Attorney, Agent, or Firm* — The Marbury Law Group, PLLC

(57) ABSTRACT

A semiconductor package includes a first die; a second die stacked on the first die in a vertical direction; a dielectric encapsulation (DE) structure surrounding the first die and the second die in a lateral direction perpendicular to the vertical direction; and a package seal ring that extends through the DE structure and surrounds the second die and at least a portion of the first die, in the lateral direction.

20 Claims, 22 Drawing Sheets

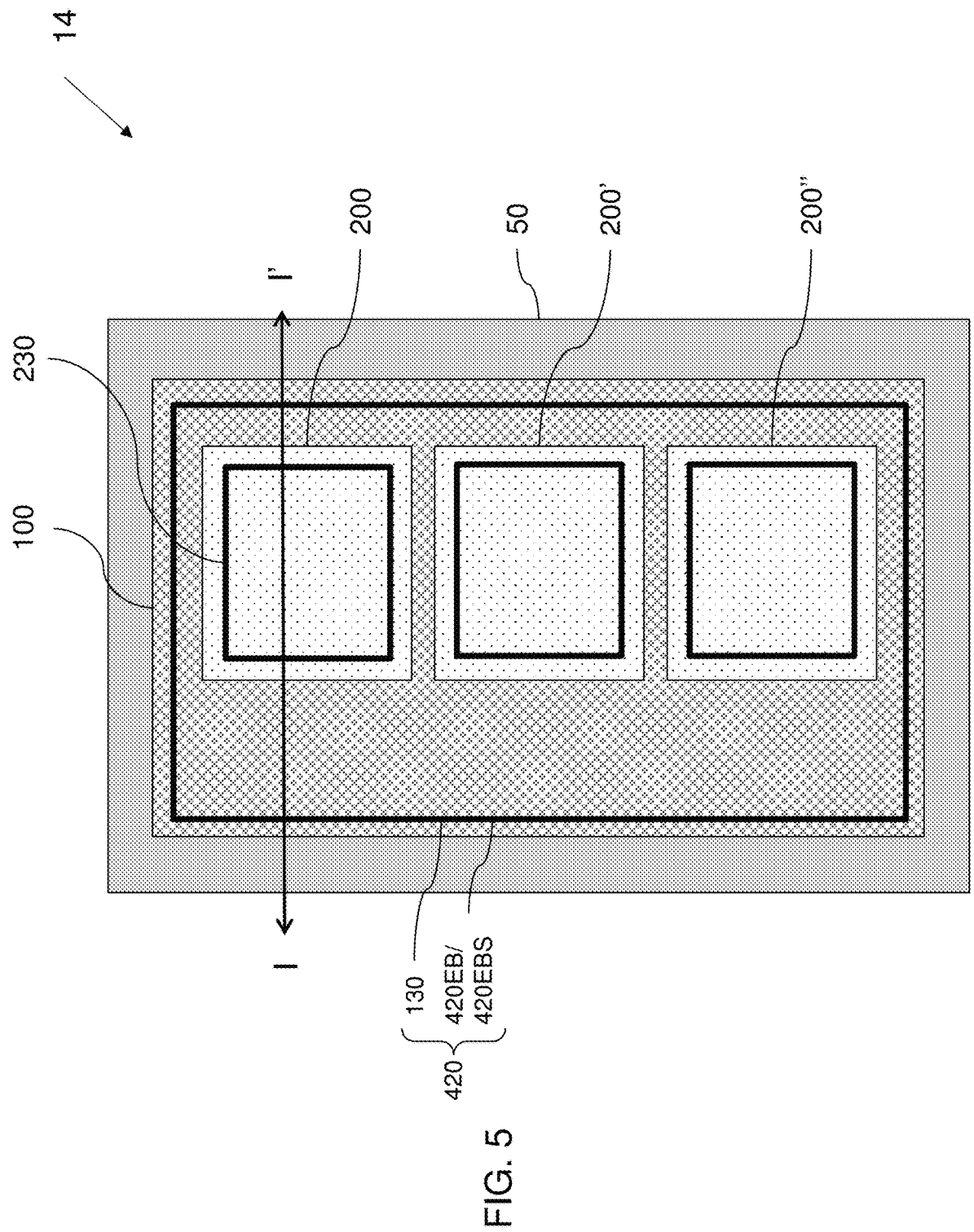

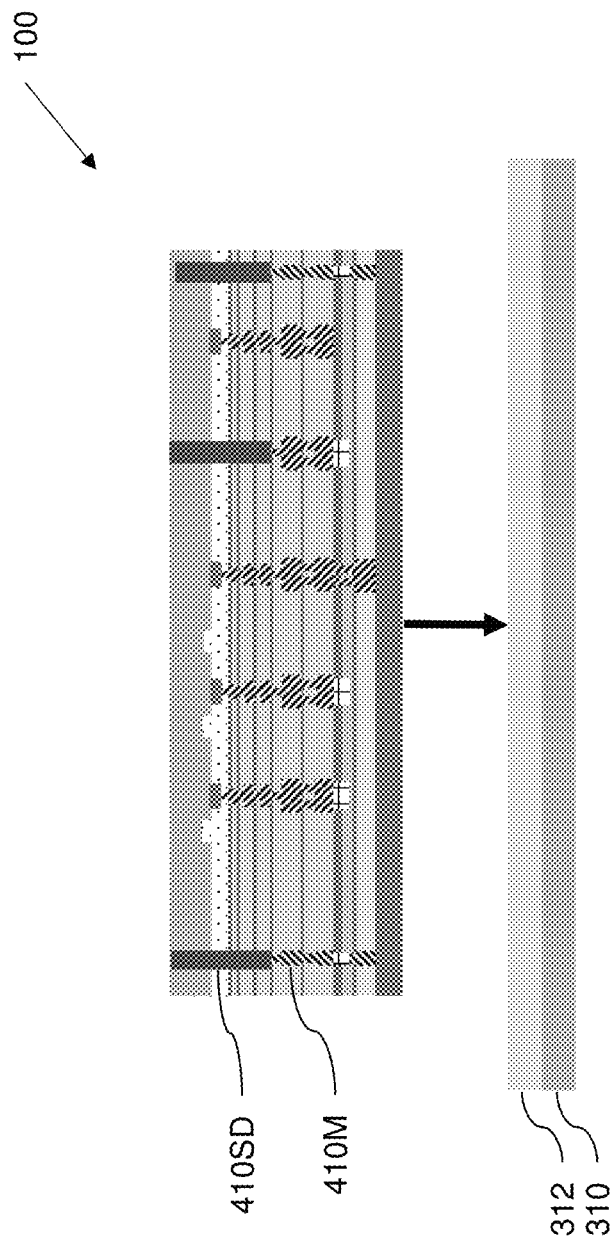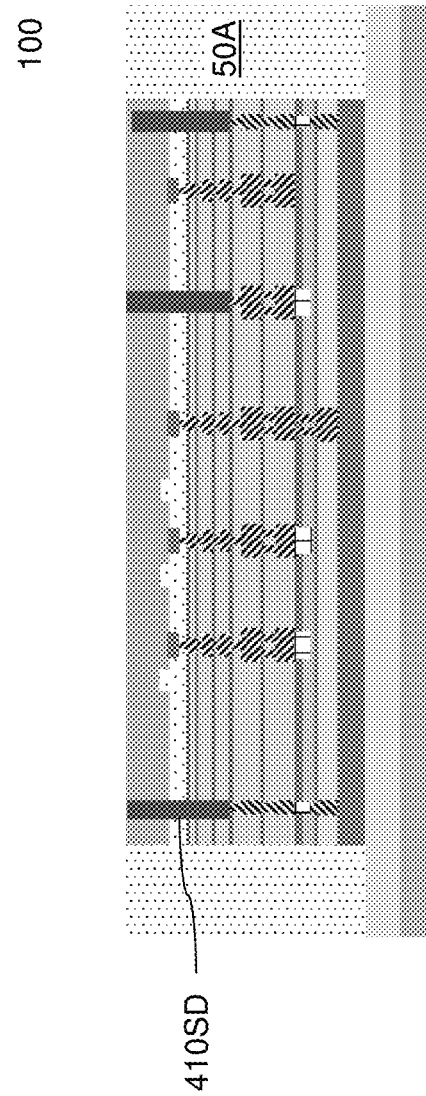

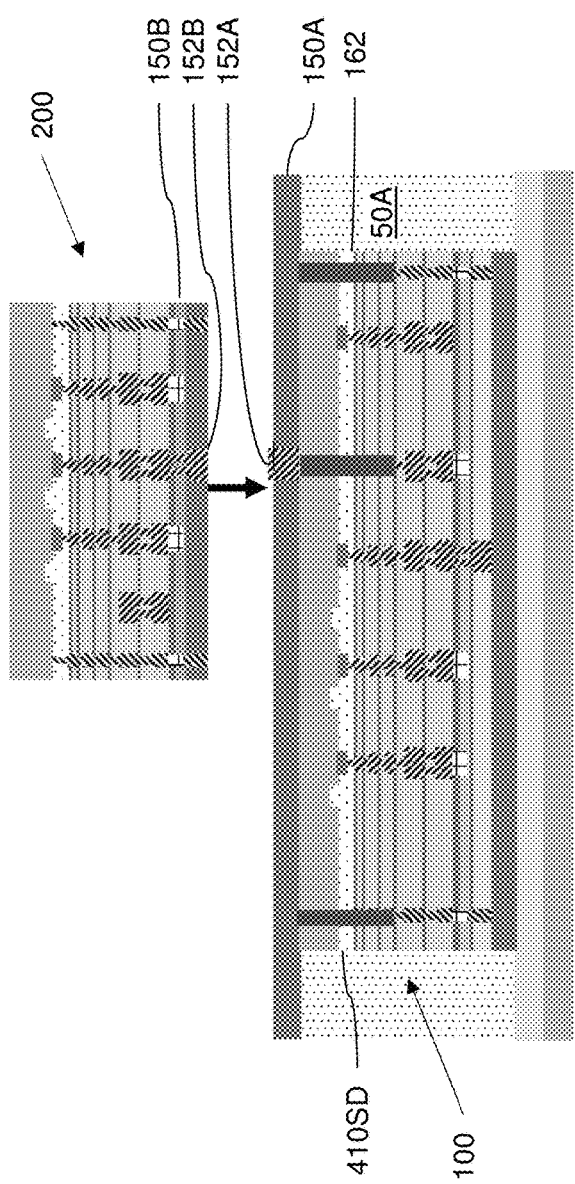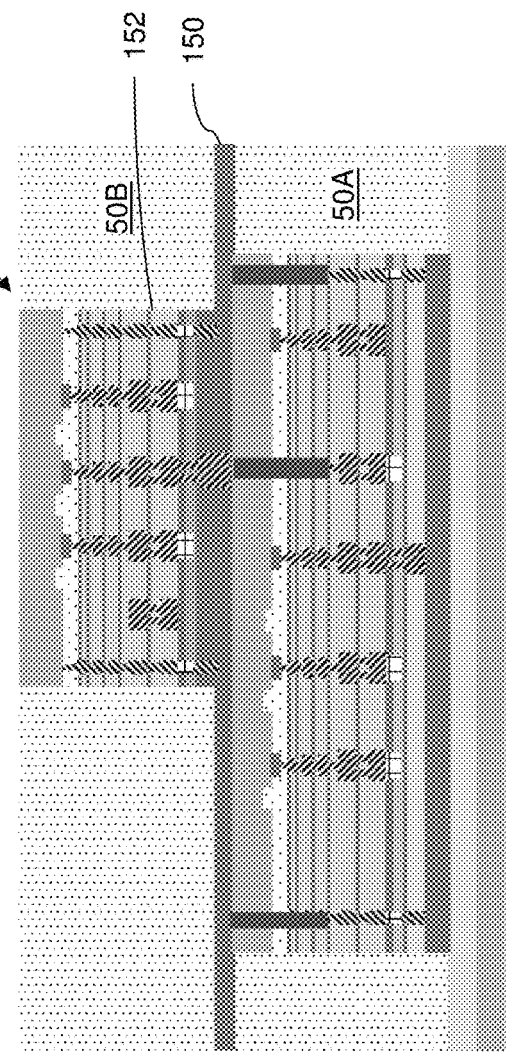
FIG. 10C
FIG. 10D

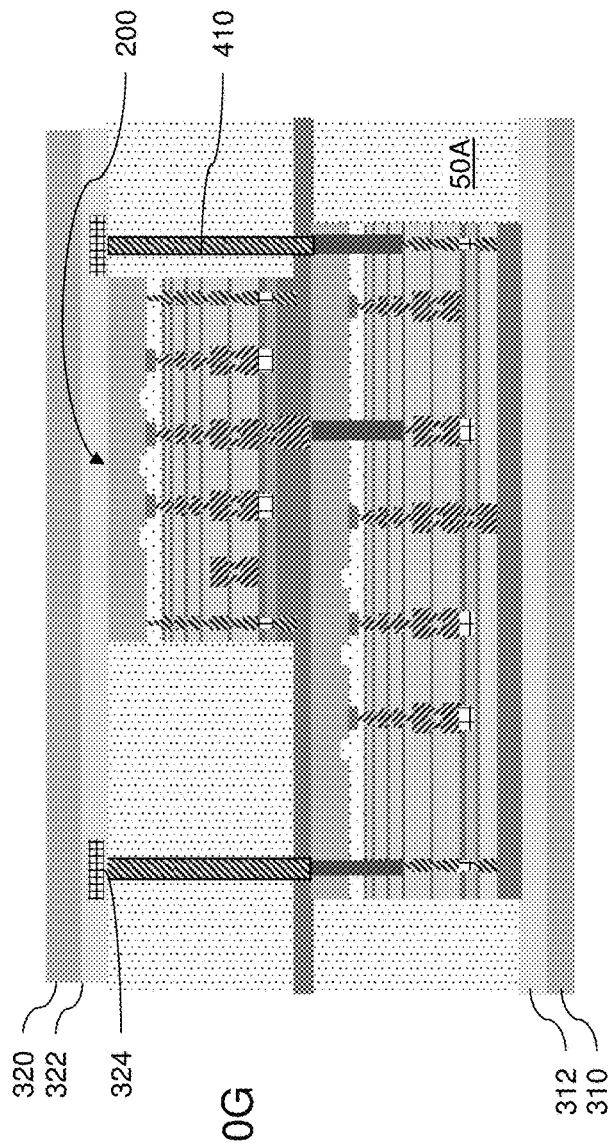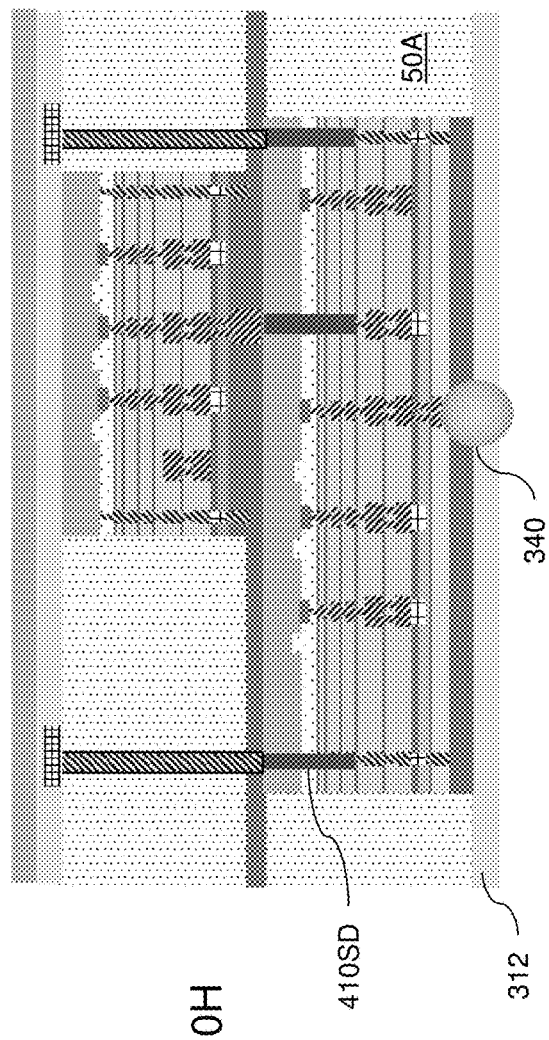

SEMICONDUCTOR PACKAGE INCLUDING PACKAGE SEAL RING AND METHODS FOR FORMING THE SAME

RELATED APPLICATIONS

This application claims priority to U.S. Provisional Patent Application No. 63/150,136 entitled "SoIC new all cover seal ring" filed on Feb. 17, 2021, the entire contents of which are hereby incorporated by reference for all purposes.

BACKGROUND

The semiconductor industry has continually grown due to improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a simplified top view of a semiconductor package 14, according to various embodiments of the present disclosure.

FIGS. 10A-10H are cross-sectional views illustrating operations of the method of FIG. 9.

DETAILED DESCRIPTION

Figure 1:
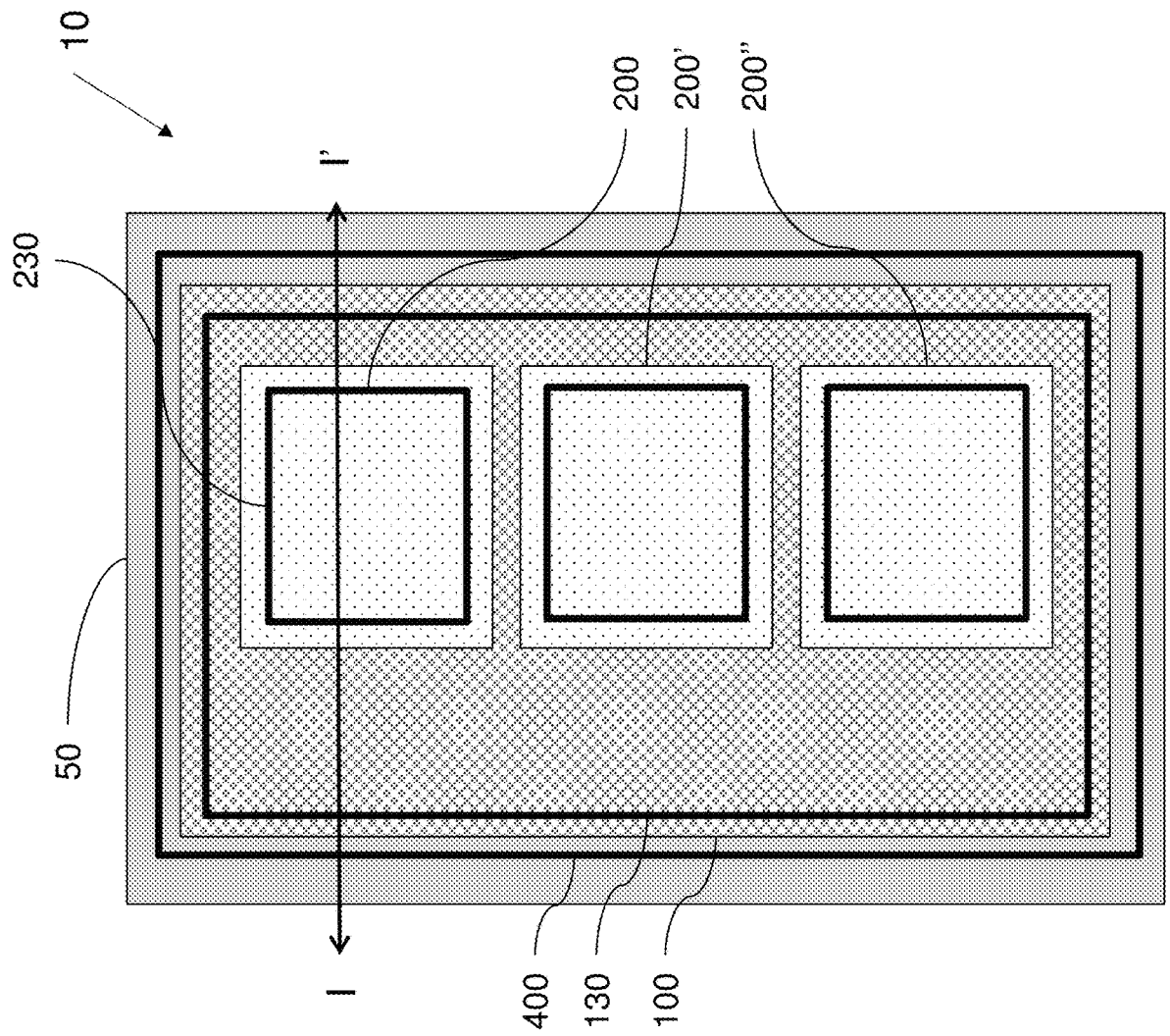
FIG. 1 is a simplified top view of an exemplary semiconductor package according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to semiconductor packages that include a package seal ring configured to protect multiple semiconductor dies included in the semiconductor package. The package seal rings may prevent contaminants from passing through bonding structures to prevent damage to the components of the different semiconductor dies. For example, the package seal ring may be configured to prevent contaminants from diffusing through a bonding structure of the semiconductor package and damaging die components.

FIG. 1 is a simplified top view of an exemplary semiconductor package 10, according to various embodiments of the present disclosure. Referring to FIG. 1, the semiconductor package 10 includes a first die 100 and at least one second die 200 disposed thereon. For example, as shown FIG. 1, the semiconductor package 10 may include three second dies 200, 200', 200". However, the present disclosure is not limited to any particular number of second dies. For ease of explanation, only the second die 200 may be described in detail below.

The first die 100 and the second die 200 may be independently selected from, for example, an application-specific integrated circuit (ASIC) chip, an analog chip, a sensor chip, a wireless and radio frequency chip, a voltage regulator chip or a memory chip. Other functional chips/dies are within the contemplated scope of disclosure. In some embodiments, the first die 100 and the second die 200 may each be an active component or a passive component.

The first die 100 may include a first seal ring 130 that surrounds the periphery of the first die 100. The second die 200 may include a second seal ring 230 that surrounds the periphery of the second die 200. The semiconductor package 10 may include a dielectric encapsulation (DE) structure 50 that surrounds the first die 100 and the second die 200. The semiconductor package 10 may also include a package seal ring 400 that may be disposed in the DE structure 50 and that surrounds both the first die 100 and the second die 200. The package seal ring 400 may be rectangular as shown in FIG. 1. However, in other embodiments the package seal ring 400 may have any suitable shape, such as a polygonal or ovoid shape. The corners of the package seal ring 400 may have a variety of angles such as octagonal, right or may be curved.

In some embodiments, the DE structure 50 includes a molding compound. The molding compound may include a resin and a filler. In alternative embodiments, the DE structure 50 may include silicon oxide, silicon nitride, a combination thereof, or the like. The DE structure 50 may be formed by spin-coating, lamination, deposition or the like.

Figure 2A:
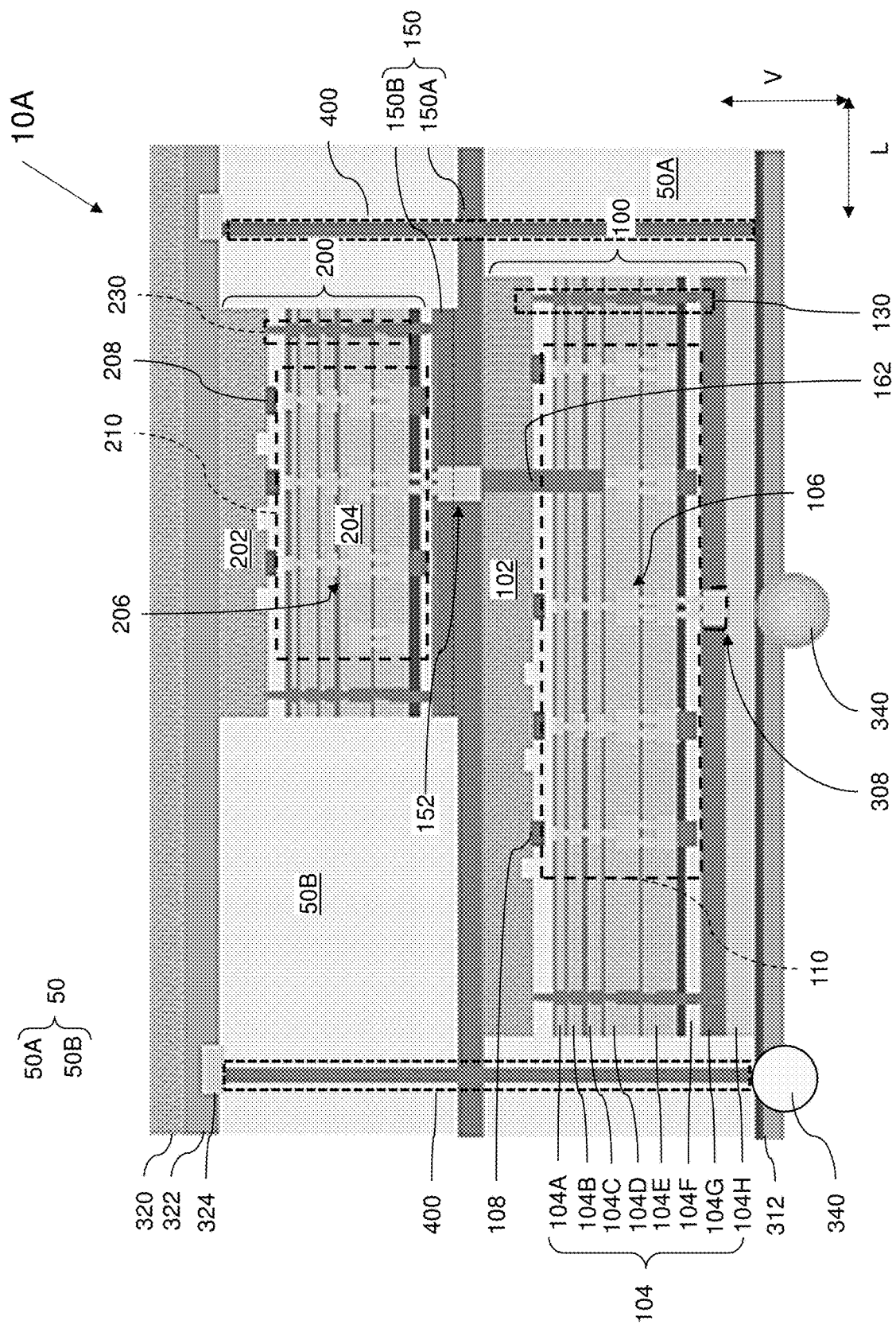
FIG. 2A is a cross-sectional view taken along line I-I' of FIG. 1, of a first example of a semiconductor package, according to various embodiments of the present disclosure.

FIG. 2A is a cross-sectional view taken along line I-I' of FIG. 1, of a first example of a semiconductor package 10A, according to various embodiments of the present disclosure. Referring to FIG. 2A, the first die 100 includes a first semiconductor substrate 102, a first dielectric structure 104, and a first metal interconnect structure 110 and the first seal ring 130 embedded within the first dielectric structure 104.

In some embodiments, the first semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device.

In some embodiments, a front surface of the first semiconductor substrate 102 may include isolation structures defining at least one active area, and a first device layer may be disposed on/in the active area. The first device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the first device layer includes a gate structure, source/drain regions, spacers, and the like.

The first dielectric structure 104 may be disposed on the face (e.g., front side) of the first semiconductor substrate 102. In some embodiments, the first dielectric structure 104 may include silicon oxide, silicon oxynitride, silicon nitride, a low dielectric constant (low-k) material, or a combination thereof. Other suitable dielectric materials may be within the contemplated scope of disclosure. The first dielectric structure 104 may be a single layer or a multiple-layer dielectric structure. For example, as shown in FIG. 2A, the first dielectric structure 104 may include multiple dielectric layers, such as a inter-layer dielectric (ILD) layers 104A-104E, a seal layer 104F, a bonding layer 104G, and a protective layer 104H.

The first dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A first metal interconnect structure 110 may be formed within the first dielectric structure 104. The first metal interconnect structure 110 may include first metal features 106 disposed in the first dielectric structure 104. The first metal features 106 may be any of a variety of metal via structures and metal lines. The first metal features 106 be formed of any suitable electrically conductive material, such as tungsten (W), copper (Cu), a copper alloy, aluminum (Al), an aluminum alloy, combinations thereof, or the like. Other suitable metal materials are within the contemplated scope of disclosure. In some embodiments, barrier layers (not shown) may be disposed between the first metal features 106 and the dielectric layers of first dielectric structure 104, to prevent the material of the first metal features 106 from migrating to the first semiconductor substrate 102. The barrier layer may include Ta, TaN, Ti, TiN, CoW, or combinations thereof, for example. Other suitable barrier layer materials may be within the contemplated scope of disclosure.

The first metal features 106 may be electrically connected to bonding pads 108 disposed on the first semiconductor substrate 102, such that the first metal interconnect structure 110 may electrically interconnect connect semiconductor devices formed on the first semiconductor substrate 102.

The first die 100 may include a through-silicon via (TSV) structure 162 that extends though the first semiconductor substrate 102. The TSV structure 162 may be electrically connected to the first metal interconnect structure 110.

The first seal ring 130 may extend around the periphery of the first die 100. For example, the first seal ring 130 may be disposed in the first dielectric structure 104 and may surround the first metal interconnect structure 110 in a lateral direction L. Herein, the lateral direction L may be a direction parallel to a plane of the first semiconductor substrate 102. The lateral direction L may be perpendicular to a vertical direction V, (e.g., a sticking direction of the first and second dies 100, 200). The first seal ring 130 may be configured to protect the first metal interconnect structure 110 from contaminant diffusion and/or physical damage during device processing, such as plasma etching and/or deposition processes.

The first seal ring 130 and/or the TSV structure 162 may include copper at an atomic percentage greater than 80%, such as greater than 90% and/or greater than 95% although greater or lesser percentages may be used. The first seal ring 130 may include conductive lines and via structures that are connected to each other, and may be formed simultaneously with respective first metal features 106 of the first metal interconnect structure 110 in the respective layers of the first dielectric structure 104. The first seal ring 130 may be electrically isolated from the first metal features 106.

In some embodiments, the first metal features 106 and/or the first seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the first metal features 106 and/or the first seal ring 130 may be formed by an electroplating process.

For example, the Damascene processes may include patterning a layer of the first dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the first dielectric structure 104.

In particular, the patterning, metal deposition, and planarizing processes may be performed for each of the dielectric layers 104, in order to form the first metal interconnect structure 110 and/or the first seal ring 130. For example, a first dielectric layer 104 may be deposited and patterned to form openings. A deposition process may then be performed to fill the openings in the first dielectric layer 104. A planarization process may then be performed to remove the overburden and form metal features 106 in the first dielectric layer 104. These process steps may be repeated to form additional dielectric layers 104 and the corresponding metal features 106, and thereby complete the first metal interconnect structure 110 and/or first seal ring 130.

The first die 100 may be disposed on a first carrier bonding layer 312. The first carrier bonding layer 312 may remain on the first die 100 after removing a first carrier substrate (not shown), such as a carrier wafer, used to support the first die 100 during manufacturing. The first carrier bonding layer 312 may be bonded to the first dielectric structure 104. Bonding pads 308 that may be electrically connected the first metal interconnect structure 110 to electrical contacts 340, such as metal pillars, micro-bumps or the like, in order to establish an electrical connection to an external circuit.

The first die 100 may be surrounded by a first dielectric encapsulation (DE) layer 50A of the DE structure 50 in the lateral direction L. Accordingly, the first DE layer 50A may cover lateral surfaces (e.g., side surfaces) of the first die 100. The first DE layer 50A may have a bottom surface that is coplanar with a top surface of the first carrier bonding layer 312 and a top surface that is coplanar with the back side of the first semiconductor substrate 102. In some embodiments, the first DE layer 50A includes a molding compound, silicon oxide, silicon nitride, a combination thereof, or the like and may be formed by spin-coating, lamination, deposition or the like.

The first die 100 may be bonded to the second die 200 by a die bonding structure 150 disposed on the backside of the first semiconductor substrate 102 and the first DE layer 50A. The die bonding structure 150 may be formed by bonding a dielectric first bonding layer 150A disposed on the first semiconductor substrate 102 and the first DE layer 50A, to a dielectric second bonding layer 150B disposed on the second die 200. The bonding process may be a hybrid bonding process that includes a metal-to-metal bonding and a dielectric-to-dielectric bonding. The first bonding layer 150A may be formed by depositing a dielectric material, such as silicon oxide, silicon nitride, a polymer, or a combination thereof, over the substrate 102 of the first die 100. The second bonding layer 150B may be formed by depositing a dielectric material, such as silicon oxide, silicon nitride, a polymer, or a combination thereof, over the second die 200. Any suitable deposition process may be used to form the first bonding layer 150A and the second bonding layer 150B. Other suitable dielectric materials may be within the contemplated scope of disclosure.

The die bonding structure 150 may include one or more die bonding pads 152. The die bonding pads 152 may be electrically conductive features formed of the same materials as the first metal features 106. For example, the die bonding pads 152 may include tungsten (W), copper (Cu), a copper alloy, aluminum (Al), an aluminum alloy, a combination thereof, or the like. The die bonding pads 152 may include bonding pads and/or via structures, in some embodiments. The die bonding pads 152 may be formed by a dual-Damascene process, or by one or more single-Damascene processes, as described above. In alternative embodiments, the die bonding pads 152 may be formed by an electroplating process. The die bonding pads 152 may be configured to electrically connect the first die 100 to the second die 200. In particular, at least one die bonding pad 152 may be electrically connected to the first metal interconnect structure 110 via the TSV structure 162.

The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type of dies or different types of chips. In some embodiments, the second die 200 may be an active component or a passive component. In some embodiments, the second die 200 may be smaller than the first die 100.

In some embodiments, the second die 200 may be similar to the first die 100. For example, the second die 200 may include a second semiconductor substrate 202, a second dielectric structure 204, a second metal interconnect structure 210 embedded within the second dielectric structure 204, and a second seal ring 230 surrounding the periphery of the second die 200. Thus, the difference between the second die 200 and the first die 100 is discussed in detail below.

The second dielectric structure 204 may be disposed over a front side of the second semiconductor substrate 202. The second dielectric structure 204 may have a single-layer or multi-layer structure. For example, as shown in FIG. 2A, the second dielectric structure 204 may include multiple dielectric layers, such as inter-layer dielectric (ILD) layers, a seal layer, and a protective layer.

The second metal interconnect structure 210 may be formed in the second dielectric structure 204. Specifically, the second metal interconnect structure 210 may be overlapped with and electrically connected to an integrated circuit region of the second semiconductor substrate 202. In some embodiments, the second metal interconnect structure 210 includes second metal features 206. The second metal features 206 are disposed in the second dielectric structure 204 and may be electrically connected to second pads 208 disposed on the second semiconductor layer 202, such that the second metal interconnect structure 210 may electrically connect semiconductor devices formed on the second semiconductor layer 202.

The second seal ring 230 may be similar to the first seal ring 130. For example, the second seal ring 230 may include copper at an atomic percentage greater than 80%, such as greater than 90% and/or greater than 95%, although greater or lesser percentages of copper may be used. The second seal ring 230 may be disposed over the first side (e.g., front side) of the second semiconductor substrate 202. Specifically, the second seal ring 230 may surround the second metal interconnect structure 210, may extend through the second dielectric structure 204, and may be electrically insulated from circuit elements of the second semiconductor substrate 202. In some embodiments, the second seal ring 230 may be formed during the formation of the second dielectric structure 204. The second seal ring 230 may be at substantially the same level as the second metal interconnect structure 210. Specifically, the top surface of the second seal ring 230 may be coplanar with the top surfaces of the uppermost second metal features 206 of the second metal interconnect structure 210.

In some embodiments, the size of the second die 200 may be different from (e.g., less than) the size of the first die 100. Herein, the term "size" may refer to the length, width and/or area. For example, as shown in the top view of FIG. 1A, the size (e.g., area or footprint) of the second die 200 may be less than the size of the first die 100.

During assembly, the first die 100 may be inverted and mounted onto the first carrier bonding layer 312. The second die 200 may be inverted and mounted onto the backside of the first die 100. As such, the first die 100 and the second die 200 may be face-to-back bonded. In other words, the front side of the second semiconductor substrate 202 may face the back side of the first semiconductor substrate. In particular, a second wafer including a plurality of the second dies 200 may be positioned over the first dies 100. In other embodiments, the second wafer may be diced to singulate the second dies 200, and the second dies 200 may be individually placed on the first die 100. In other embodiments, different second dies 200 from separate wafers may be individually placed on, and bonded to, the first die 100.

A second DE layer 50B of the DE structure 50 may be disposed on the bonding structure 150 and around the second die 200. The second DE layer 50B may be coplanar with the backside of the second semiconductor layer 202, and may cover the top surface of the first bonding layer 150A and side surfaces of the second bonding layer 150B. The second DE layer 50B may be formed of the same material as the first DE layer 50A. For example, the second DE layer 50B may be formed of a molding compound that may include a resin and a filler, silicon oxide, silicon nitride, a combination thereof, or the like. The second DE layer 50B may be formed by spin-coating, lamination, deposition, or the like.

In some embodiments, a second carrier 320, such as a carrier wafer or the like, may be attached to the DE structure 50 and the backside of the second semiconductor layer 202. In particular, the second carrier 320 may be attached using a second carrier bonding layer 322 including metal contacts 324. The metal contacts 324 may be configured to electrically ground the package seal ring 400.

According to various embodiments, the package seal ring 400 may extend through the first DE layer 50A, the bonding structure 150, and the second DE layer 50B. In particular, the package seal ring 400 may completely surround the first die 100 and any second dies 200 (200', 200" etc.) disposed thereon, in the lateral direction. In some embodiments, the package seal ring 400 may be disposed outside of the periphery of the first die 100 and the periphery of the second die(s) 200. The package seal ring 400 may have any suitable shape, such as a polygonal shape or an ovoid shape. The corners of the package seal ring 400 may have a variety of angles such as octagonal, right or may be curved.

In some embodiments, package seal ring 400 may be spaced apart from the first die 100 and the second die 200 by portions of the DE structure 50. In other words, a portion of the first DE layer may be disposed between the package seal ring 400 and the first die 100, and a portion of the second DE layer 50A may be disposed between the package seal ring 400 and the second die 200, since the package seal ring 400 extends through the first DE layer 50A and the second DE layer 50B.

The package seal ring 400 may be formed of metal or metal alloy materials and may be configured to prevent contaminants from reaching the first and second dies 100, 200. For example, the package seal ring 400 may be formed of Cu, TaN, Al, TiW, combinations thereof, or the like. The package seal ring 400 may be formed as a single layer or multiple layers. The package seal ring 400 may have a width (e.g., thickness) of at least 0.1 µm, such as a width ranging from 0.15 µm to 100 µm, or from 0.2 µm to 50 µm.

In some embodiments, the package seal ring 400 may be electrically grounded. In other embodiments, the package seal ring 400 may be electrically floated. For example, the package seal ring 400 may be grounded via an optional one of the electrical contacts 340.

Figure 2B:
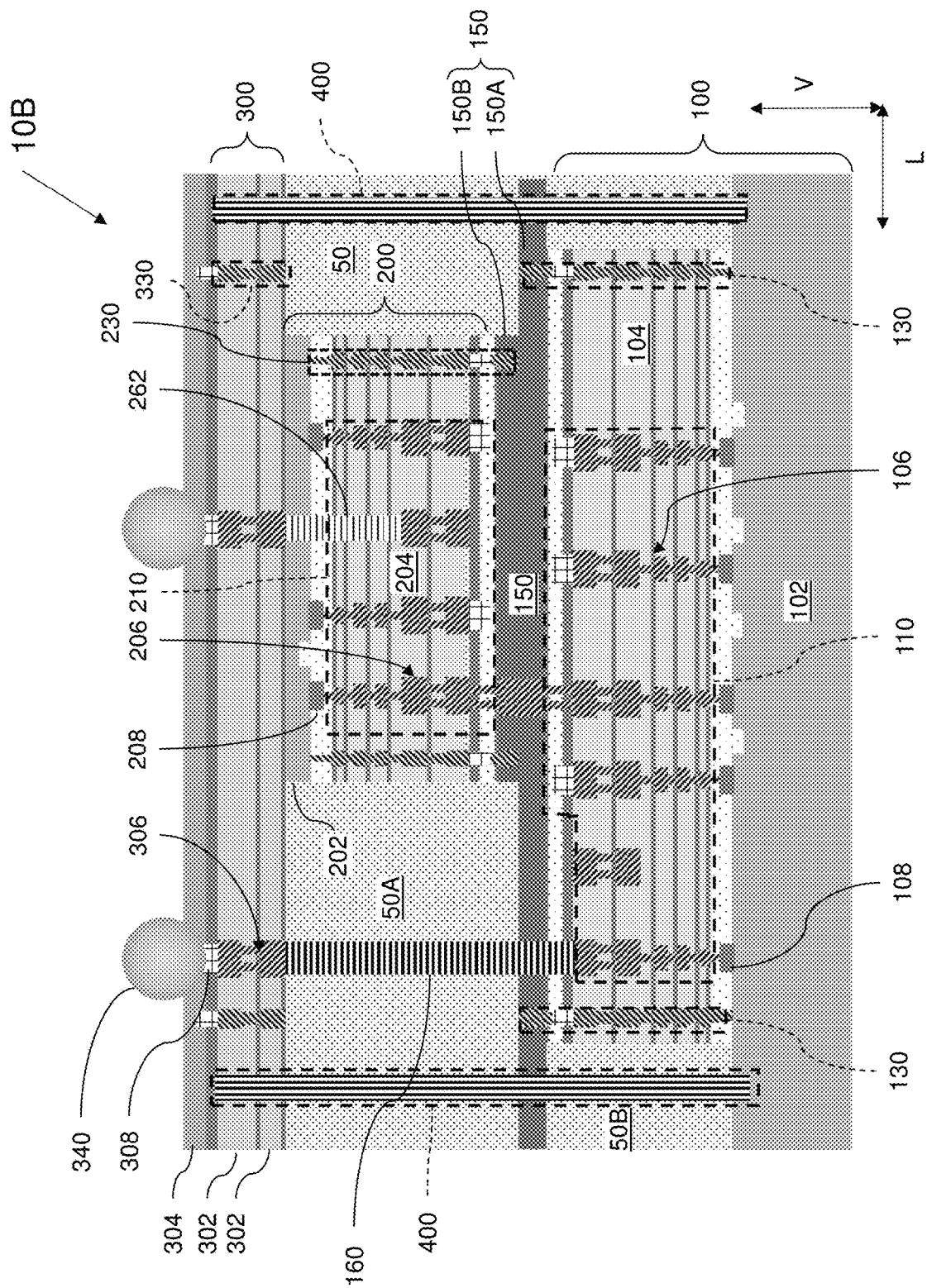
FIG. 2B is a cross-sectional view taken along line I-I' of FIG. 1, of a second example of a semiconductor package, according to various embodiments of the present disclosure.

FIG. 2B is a cross-sectional view taken along line I-I' of FIG. 1, of an alternative semiconductor package 10B, according to various embodiments of the present disclosure. The semiconductor package 10B may be similar to the semiconductor package 10A. Accordingly, only the differences there between are discussed in detail.

Referring to FIG. 2B, in the semiconductor package 10B, the first die 100 and the second die(s) 200 may be face-to-face bonded. In particular, the second die 200 may be inverted and bonded to the first die 100, such that a front side of the first semiconductor substrate 102 and a front side of the second semiconductor substrate 202 face each other, with the first metal interconnect structure 110 and the second metal interconnect structure 210 disposed there between.

The semiconductor package 10B may include a DE structure 50 including a first DE layer 50A formed around the first die 100 and a second DE layer 50B formed around the second die 200. Through-dielectric via (TDV) structures 160 may extend through the DE structure 50 and the bonding structure 150, to electrically contact the first metal interconnect structure 110.

In some embodiments, the TDV structures 160 may include an electrically conductive material, such as Cu, a Cu alloy, Al, an Al alloy, a combination thereof, or the like. In some embodiments, a diffusion barrier layer (not shown) may be disposed around the TDV structures 160, to prevent metal diffusion into the DE structure 50. The diffusion barrier layer may include Ta, TaN, Ti, TiN, CoW, or a combination thereof. Other suitable barrier layer materials may be within the contemplated scope of disclosure.

A redistribution layer structure 300 may be formed on the second die 200 and the DE structure 50. The redistribution layer structure 300 may be disposed over the back side of the second semiconductor substrate 202 and over the DE structure 50. The redistribution layer structure 300 may comprise one or more third dielectric layers 302, electrically conductive metal features 306 disposed therein. A passivation layer 304 may be disposed on the redistribution layer structure 300. In some embodiments, the metal features 306 may be electrically connected to the TDV structures 160 and/or to the TSV structures 262.

In some embodiments, the redistribution layer structure 300 may include a photo-sensitive material such as polybenzoxazole (PBO), polyimide (PI), benzocyclobutene (BCB), or a combination thereof. In some embodiments, the metal features 306 may include Cu, Ni, Ti, or a combination thereof. Other suitable conductive metal materials and/or photo-sensitive materials may be within the contemplated scope of disclosure to form the metal features 306.

The redistribution layer structure 300 may include device bonding pads 308 and a third seal ring 330. The third seal ring 330 may surround the metal features 306. The third seal ring 330 may include materials and structures similar to that of the first seal ring 130 and/or the second seal ring 230.

In some embodiments, the device bonding pads 308 may be under bump metallization (UBM) pads for mounting electrical contacts 340, such as metal pillars, micro-bumps or the like. The device bonding pads 308 may include a metal or a metal alloy. The device bonding pads 308 may include aluminum, copper, nickel, an alloy thereof, or the like, for example. Other suitable pad materials may be within the contemplated scope of disclosure.

The passivation layer 304 may cover the third dielectric layers 302 and edge portions of the device bonding pads 308. Upper surfaces of the device bonding pads 308 may be exposed through the passivation layer 304. In some embodiments, the passivation layer 304 includes silicon oxide, silicon nitride, benzocyclobutene (BCB) polymer, polyimide (PI), polybenzoxazole (PBO), or a combination thereof. Other suitable passivation layer materials may be within the contemplated scope of disclosure.

The package seal ring 400 may extend from the first semiconductor substrate 102, through the DE structure 50, through the third dielectric layers 302, and to the passivation layer 304. The package seal ring 400 may surround of the first seal ring 130, the second seal ring 230, and the third seal ring 330 in the lateral direction L. The package seal ring 400 may also extend through the bonding structure 150.

The package seal ring 400 may be formed of a metal or metal alloy, such as Cu, TaN, Al, TiW, combinations thereof, or the like. In some embodiments, the package seal ring 400 may be formed by depositing a barrier layer (e.g., Ta/TaN barrier layer) be in a trench formed in the package structure 10B, depositing a copper seed layer on the barrier layer using, for example, plasma vapor deposition of the like, and then growing a copper layer on the barrier layer using electroplating, for example.

Figure 2C:
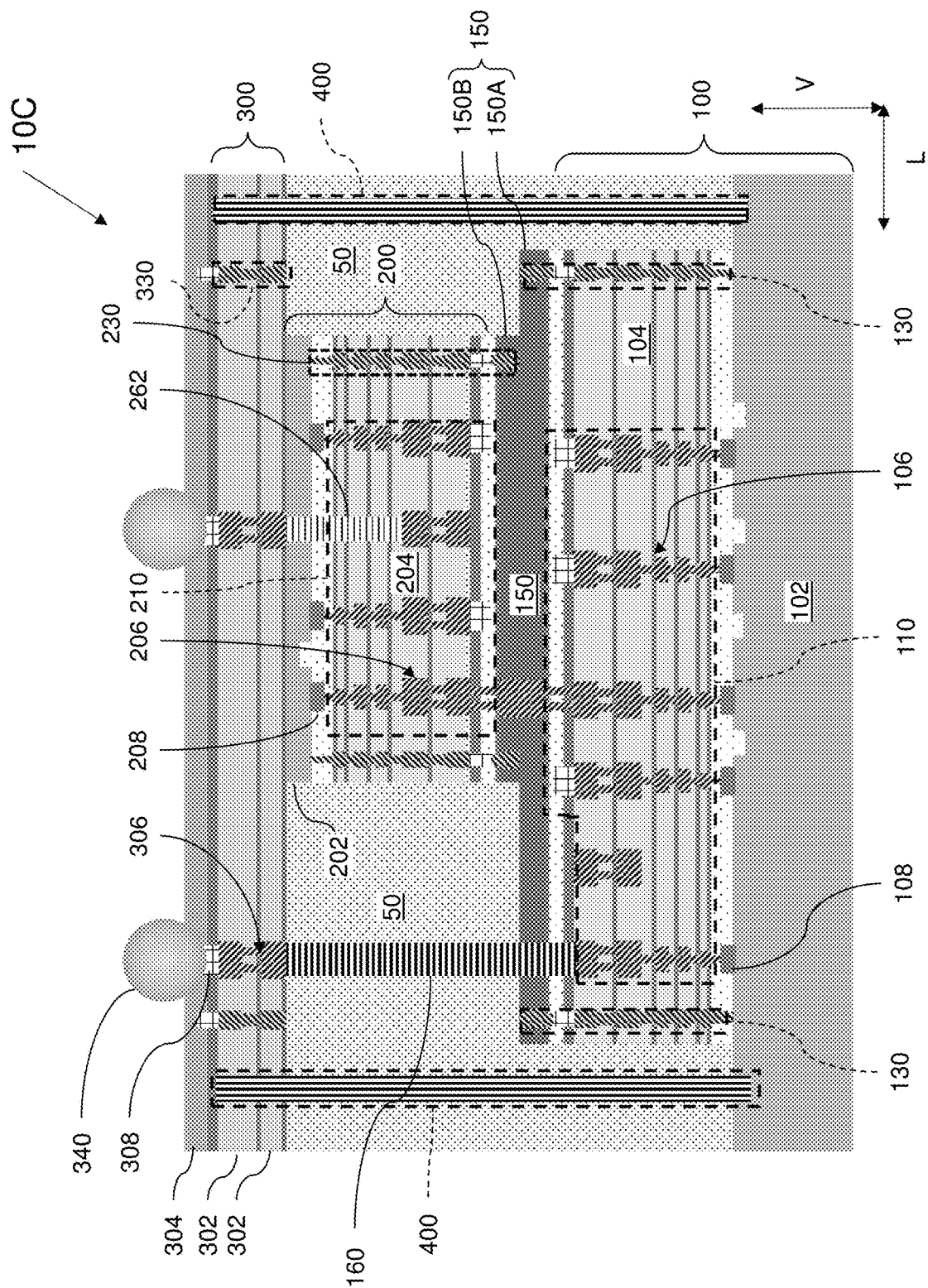
FIG. 2C is a cross-sectional view taken along line I-I' of FIG. 1, of a third example of a semiconductor package, according to various embodiments of the present disclosure.

FIG. 2C is a cross-sectional view taken along line I-I' of FIG. 1, of an alternative semiconductor package 10C, according to various embodiments of the present disclosure. The semiconductor package 10C may be similar to the semiconductor package 10B. Accordingly, only the differences there between are discussed in detail.

Referring to FIG. 2C, in the semiconductor package 10C, the first die 100 and the second die(s) 200 may be face-to-face bonded. In particular, the second die 200 may be inverted and bonded to the first die 100, such that a front side of the first semiconductor substrate 102 and a front side of the second semiconductor substrate 202 face each other, with the first metal interconnect structure 110 and the second metal interconnect structures 210 disposed there between.

The semiconductor package 10C may include a bonding structure 150 that includes a first bonding layer 150A and a second bonding layer 150B. However, the first bonding layer 150A may be disposed within the perimeter of the first die 100. A single-layer DE structure 50 may be formed around the first and second dies 100, 200. Through-dielectric via (TDV) structures 160 may extend through the DE structure 50 and the bonding structure 150, to electrically contact the first metal interconnect structure 110. A redistribution layer structure 300 may be formed on the second die 200 and the DE structure 50.

In some embodiments, the semiconductor package 10C may include a package seal ring 400 that extends through the DE structure 50 without passing through the bonding structure 150. The package seal ring 400 may extend through the redistribution layer 300. The package seal ring 400 may extend from an upper surface of the first die 100, or may partially extend into the first semiconductor substrate 102.

Figure 3:
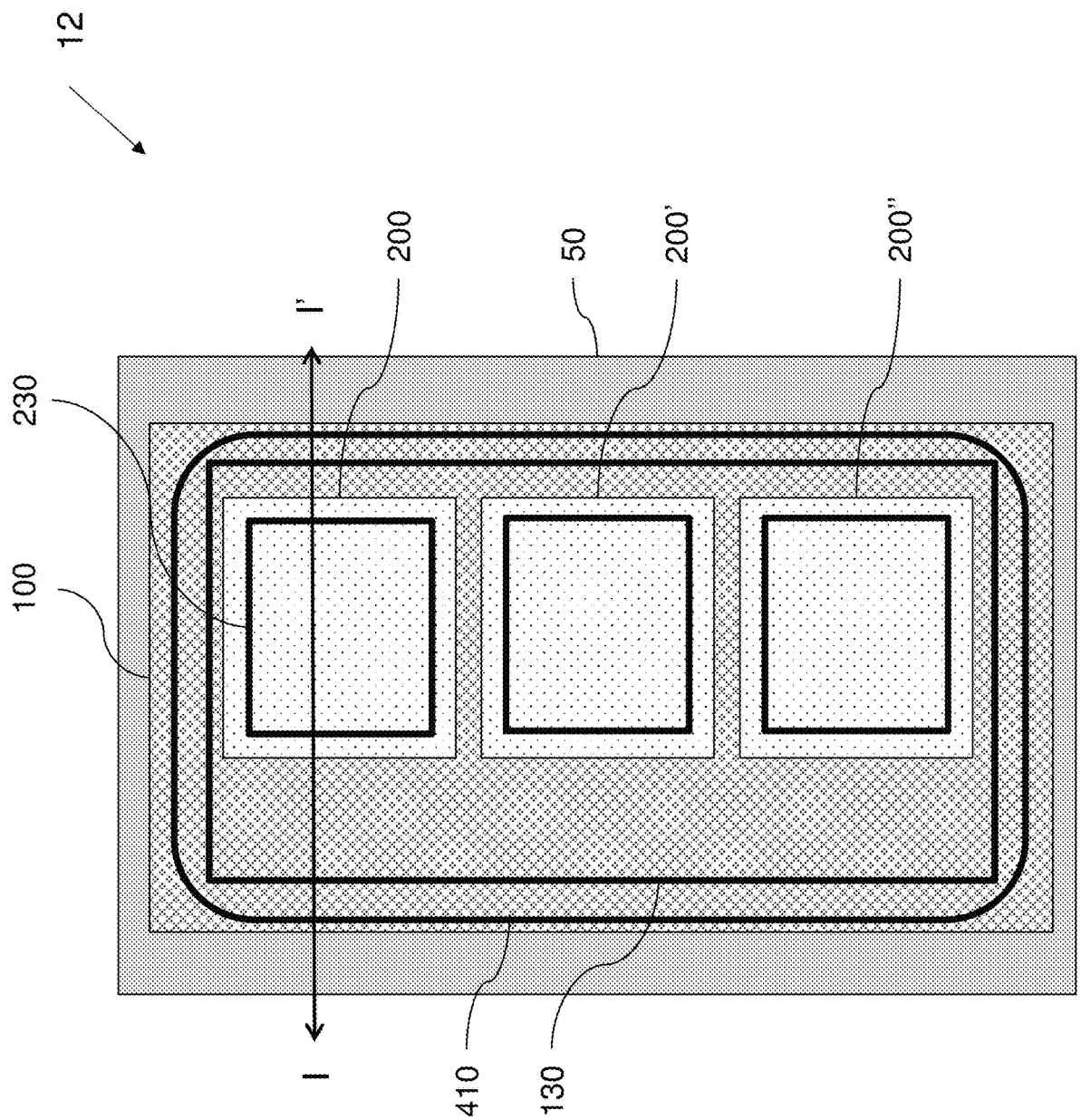
FIG. 3 is a simplified top view of a semiconductor package 12, according to various embodiments of the present disclosure.

FIG. 3 is a simplified top view of a semiconductor package 12, according to various embodiments of the present disclosure. The semiconductor package 12 may be similar to the semiconductor package 10. As such, only the differences there between will be described in detail.

Referring to FIG. 3, the semiconductor package 12 includes a first die 100 and at least one second die 200 disposed thereon. For example, as shown FIG. 3, the semiconductor package 12 may include three second dies 200, 200', 200". However, the present disclosure is not limited to any particular number of second dies. For ease of explanation, only the second die 200 is described in detail below.

The first die 100 and the second die(s) 200 may be independently selected from, for example, an application-specific integrated circuit (ASIC) chip, an analog chip, a sensor chip, a wireless and radio frequency chip, a voltage regulator chip or a memory chip. In some embodiments, the first and second dies 100, 200 may each be an active component or a passive component.

The first die 100 may include a first seal ring 130 and the second die 200 may include a second seal ring 230. The semiconductor package 12 may include a DE structure 50 that surrounds the first die 100 and the second die(s) 200. The semiconductor package 12 may also include a package seal ring 400 that may be disposed in the first dielectric structure 104. In particular, the package seal ring 410 may surround the second die(s) 200 and may overlap with the first die 100. In other words, the package seal ring 410 may be disposed inside of the periphery of the first die 100, at least with respect to the lateral direction L.

Figure 4A:
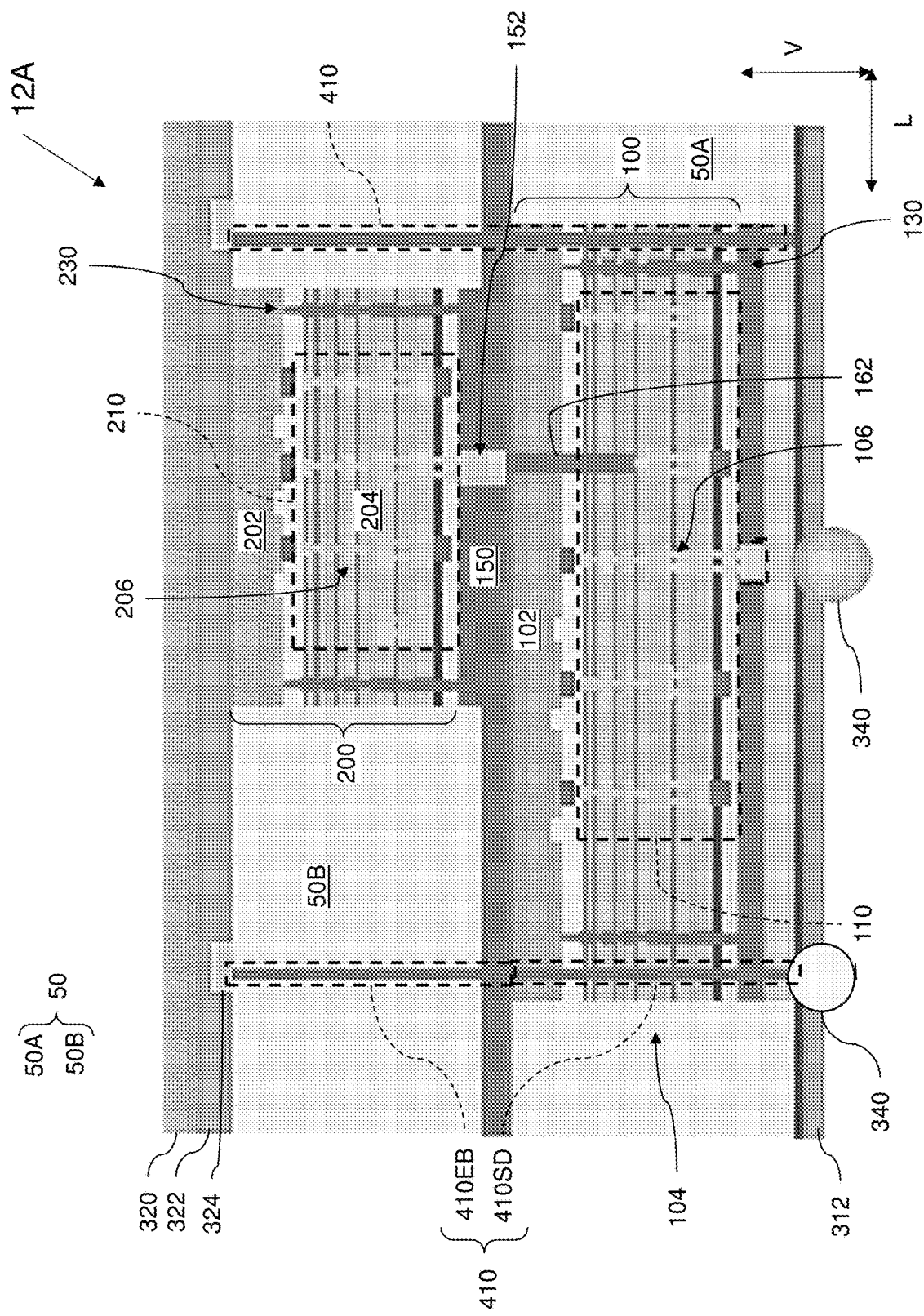
FIG. 4A is a cross-sectional view taken along line I-I' of FIG. 3, of a fourth example of a semiconductor package, according to various embodiments of the present disclosure.

FIG. 4A is a cross-sectional view taken along line I-I' of FIG. 3, of a semiconductor package 12A, according to various embodiments of the present disclosure. Referring to FIG. 4A, the semiconductor package 12A may be similar to the semiconductor package 10A of FIG. 2A. As such, only the differences there between will be described in detail.

Referring to FIG. 4A, in the semiconductor package 12A, the second die 200 may be face-to-back bonded with the first die 100. In addition, the DE structure 50 includes a first DE layer 50A that encapsulates the first die 100, and a second DE layer 50B that encapsulates the second die 200. The first DE layer 50A may be separated from the second DE layer 50B by a bonding structure 150.

The package seal ring 410 may be formed of a metal or metal alloy, such as Cu, TaN, Al, TiW, combinations thereof, or the like. In some embodiments, the package seal ring 410 may be formed by depositing a barrier layer (e.g., Ta/TaN barrier layer) be in a trench formed in the semiconductor package 12A, depositing a copper seed layer on the barrier layer using, for example, plasma vapor deposition of the like, and then growing a copper layer on the barrier layer using electroplating, for example.

The package seal ring 410 may have a width (e.g., thickness) of at least 0.1 μm, such as a width ranging from 0.15 μm to 100 μm, or from 0.2 μm to 50 μm. The package seal ring 410 may extend through the second DE layer 50B, the bonding structure 150, and the first die 100. The package seal ring 410 may be disposed inside the perimeter of the first die 100 and outside of the perimeter of the first seal ring 130, with respect to the lateral direction L. In some embodiments, the package seal ring 410 may be electrically floated. In other embodiments, the package seal ring 410 may be grounded. For example, the package seal ring 410 may be grounded via an electrical contact 340.

In some embodiments, the package seal ring 410 may include a DE-bonding seal ring 410EB that extends through the second DE layer 50B and the bonding structure 150, and a substrate-dielectric seal ring 410SD that extends through the first semiconductor substrate 102 and the first dielectric structure 104. The DE-bonding seal ring 410EB and the substrate-dielectric seal ring 410SD may directly contact one another and may overlap in the lateral direction L.

In various embodiments, the package seal ring 410 may be formed multiple etching and deposition processes. For example, first etching and deposition processes may be used to form the DE-bonding seal ring 410EB and a second etching and deposition processes may be used to form the substrate-dielectric seal ring 410SD. The DE-bonding seal ring 410EB and the substrate-dielectric seal ring 410SD may be connected during formation. In other embodiments, a single etching and deposition process may be used to form the package seal ring 410, without separately forming the DE-bonding seal ring 410EB and the substrate-dielectric seal ring 410SD.

Figure 4B:
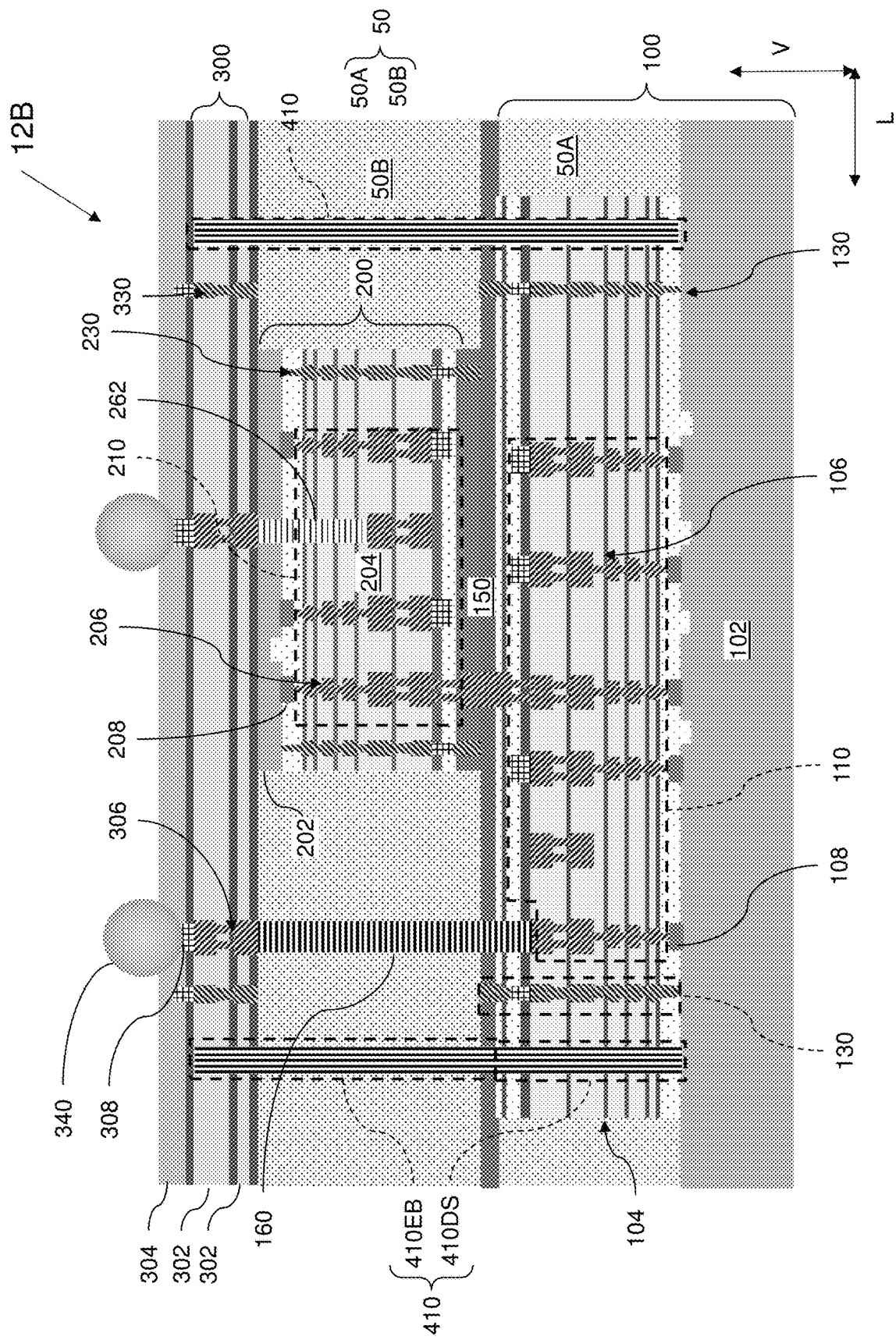
FIG. 4B is a cross-sectional view taken along line I-I' of FIG. 3, a fifth example of a semiconductor package, according to various embodiments of the present disclosure.

FIG. 4B is a cross-sectional view taken along line I-I' of FIG. 3, of a semiconductor package 12B, according to various embodiments of the present disclosure. The semiconductor package 12B may be similar to the semiconductor package 10B of FIG. 2B. As such, only the differences there between will be described in detail.

Referring to FIG. 4B, in the semiconductor package 12B, the least one second die 200 may be bonded to the first die 100 in a face-to-face bonding configuration. In addition, the DE structure 50 includes a first DE layer 50A that encapsulates the first die 100, and a second DE layer 50B that encapsulates the second die 200. The first DE layer 50A may be separated from the second DE layer 50B by a bonding structure 150. The fourth embodiment may also include a TDV structure 160, the package seal ring 410, and a redistribution layer structure 300.

The package seal ring 410 may be formed of a metal or metal alloy, such as Cu, TaN, Al, TiW, combinations thereof, or the like. The package seal ring 410 may have a width (e.g., thickness) of at least 0.1 μm, such as a width ranging from 0.15 μm to 100 μm, or from 0.2 μm to 50 μm.

The package seal ring 410 may extend through third dielectric layers 302 of the redistribution layer structure 300, the second DE layer 50B, the bonding structure 150, and into the first die 100. The package seal ring 410 may be disposed inside the perimeter of the first die 100 and outside of the perimeter of the first seal ring 130, second seal ring 230, and third seal ring 330, with respect to the vertical direction V.

In other words, the package seal ring 410 may surround the first seal ring 130, the second seal ring 230, and the third seal ring 330.

In some embodiments, the package seal ring 410 may include a DE-bonding seal ring 410EB that extends through the second DE layer 50B and the bonding structure 150, and a dielectric structure seal ring 410DS that extends through the first semiconductor substrate 102 and the first dielectric structure 104. The DE-bonding seal ring 410EB and the dielectric structure seal ring 410DS may directly contact one another and may overlap in the lateral direction L.

The package seal ring may be formed using multiple etching processes and deposition processes, or by using a single etching process and deposition process. For example, a first etching and deposition process may be used to form the DE-bonding seal ring 410EB, and second etching and deposition processes may be used to from the dielectric structure seal ring 410DS. In other embodiments, a single etching and deposition process may be used to form the package seal ring 410, without separately forming the DE-bonding seal ring 410DS and the dielectric structure seal ring 410DS.

Figure 4C:
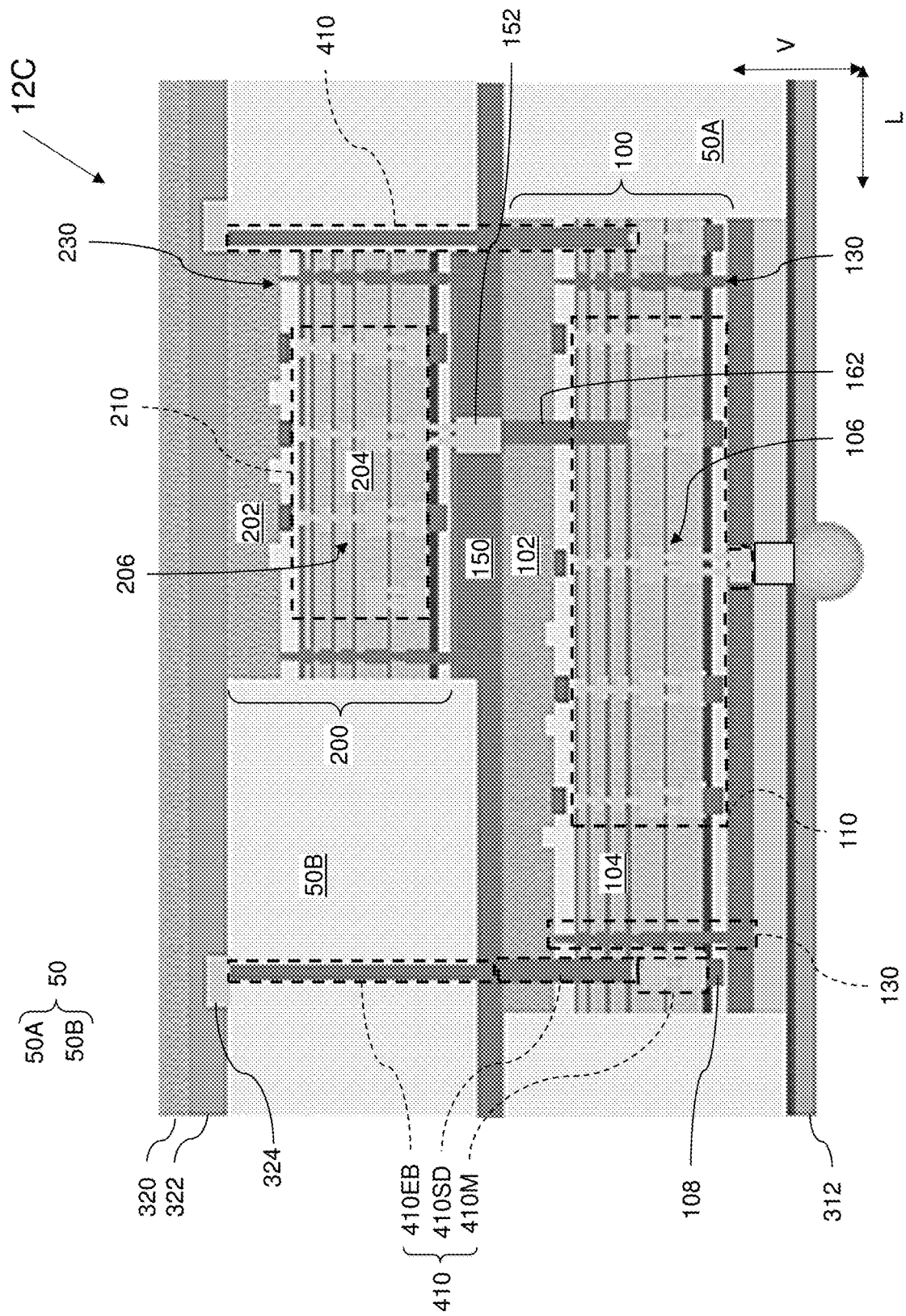
FIG. 4C is a cross-sectional view taken along line I-I' of FIG. 3, a sixth example of a semiconductor package, according to various embodiments of the present disclosure.

FIG. 4C is a cross-sectional view taken along line I-I' of FIG. 3, of a semiconductor package 12C, according to various embodiments of the present disclosure. The semiconductor package 12C may be similar to the semiconductor package 12A of FIG. 4A. As such, only the differences there between will be described in detail.

Referring to FIG. 4C, in the semiconductor package 12C, the at least one second die 200 may be bonded to the first die 100 in a face-to-back configuration. In addition, the DE structure 50 includes a first DE layer 50A that encapsulates the first die 100, and a second DE layer 50B that encapsulates the second die 200. The first DE layer 50A may be separated from the second DE layer 50B by a bonding structure 150.

The package seal ring 410 may be formed of a metal or metal alloy, such as Cu, TaN, Al, TiW, combinations thereof, or the like. The package seal ring 410 may have a width (e.g., thickness) of at least 0.1 μm, such as a width ranging from 0.15 μm to 100 μm, or from 0.2 μm to 50 μm. The package seal ring 410 may extend through the second DE layer 50B, the bonding structure 150, and the first die 100.

In particular, the package seal ring 410 may be disposed inside the perimeter of the first die 100 and may be disposed outside of the perimeter of the second die 200. In other words, the package seal ring 410 may surround both the first seal ring 130 and the second seal ring 230, in the lateral direction L.

In some embodiments, the package seal ring 410 may include a DE-bonding seal ring 410EB that extends through the second DE layer 50B and the bonding structure 150, a substrate-dielectric seal ring 410SD that extends through the first semiconductor substrate 102 and into the first dielectric structure 104, and a metal features seal ring 410M that extend from the substrate-dielectric seal ring 410SD to the bonding pads 108. The DE-bonding seal ring 410EB, the substrate-dielectric seal ring 410SD, and the metal features seal ring 410M may directly contact one another and may overlap in the lateral direction L.

The package seal ring 410 may be formed using multiple etching and deposition processes. For example, first etching and deposition processes may be used to form the metal features seal ring 410M, second etching and deposition processes may be used to form the substrate-dielectric seal ring 410SD, and third etching and deposition processes may be used to for the DE-bonding seal ring 410EB. In some embodiments, the metal features seal ring 410M may be formed during the formation of the metal features 106, the substrate-dielectric seal ring 410SD may be formed during the formation of the TSV structures 162, and the DE-bonding seal ring 410EB may be formed after forming the second DE layer 50B.

FIG. 5 is a simplified top view of a semiconductor package 14, according to various embodiments of the present disclosure. The semiconductor package 14 may be similar to the semiconductor package 10. As such, only the differences there between will be described in detail.

Referring to FIG. 5, the semiconductor package 14 includes a first die 100 and at least one second die 200 disposed thereon. For example, as shown FIG. 5, the semiconductor package 14 may include three second dies 200, 200', 200''. However, the present disclosure is not limited to any particular number of second dies. For ease of explanation, only the second die 200 is described in detail below.

The first and second dies 100, 200 may be independently selected from, for example, an application-specific integrated circuit (ASIC) chip, an analog chip, a sensor chip, a wireless and radio frequency chip, a voltage regulator chip or a memory chip. In some embodiments, the first and second dies 100, 200 may each be an active component or a passive component.

The first die 100 may include a first seal ring 130 and the second die 200 may include a second seal ring 230. The semiconductor package 14 may include a DE structure 50 that surrounds the first die 100 and the second die(s) 200. The semiconductor package 14 may also include a package seal ring 420 that may be disposed in the DE structure 50. In particular, the package seal ring 420 may surround the second die 200 and may overlap with the first die 100 and/or first seal ring 130, in the lateral direction L. The package seal ring 420 may include a DE-bonding seal ring 420EB or a DE-bonding-substrate seal ring 420EBS, and the first seal ring 130.

Figure 6A:
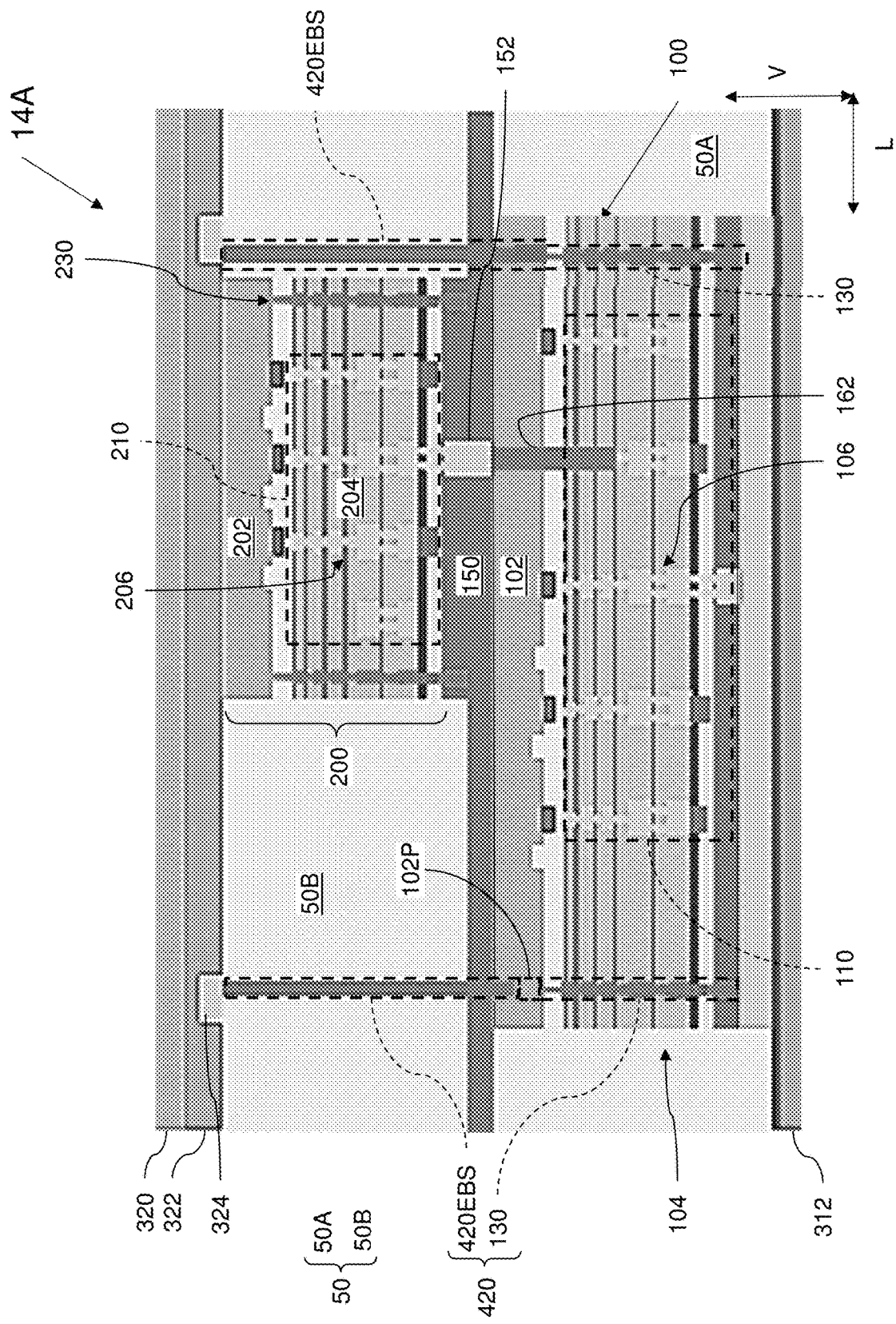
FIG. 6A is a cross-sectional view taken along line I-I' of FIG. 5, a seventh example of a semiconductor package, according to various embodiments of the present disclosure.

FIG. 6A is a cross-sectional view taken along line I-I' of FIG. 5, of a semiconductor package 14A according to various embodiments of the present disclosure. The semiconductor package 14A may be similar to the semiconductor package 12A of FIG. 4A. As such, only the differences there between will be described in detail.

Referring to FIG. 6A, in the semiconductor package 14A, the second die 200 may be face-to-back bonded with the first die 100. In addition, the DE structure 50 may include a first DE layer 50A that encapsulates the first die 100, and a second DE layer 50B that encapsulates the second die 200. The first DE layer 50A may be separated from the second DE layer 50B by a bonding structure 150.

The semiconductor package 14A may include the DE-bonding-substrate seal ring 420EBS, which extends through the second DE layer 50B, the bonding structure 150, and into the first semiconductor substrate 102. The DE-bonding-substrate seal ring 420EBS may overlap with the first seal ring 130 in the vertical direction V.

DE-bonding-substrate seal ring 420EBS may surround the second die 200 in the lateral direction L may be separated from the first seal ring 130 in the vertical direction V by a portion 102P of the first semiconductor substrate 102, shown on the left side of FIG. 6A. However, in other embodiments, the DE-bonding-substrate seal ring 420EBS may extend completely through the first semiconductor substrate 102 and directly contacts the first seal ring 130, as shown on the right side of FIG. 6A.

The DE-bonding-substrate seal ring 420EBS and the first seal ring 130 may collectively form the package seal ring 420. The package seal ring 420 (e.g., the DE-bonding-substrate seal ring 420EBS and the first seal ring 130) may be formed of a metal or metal alloy, such as Cu, TaN, Al, TiW, combinations thereof, or the like. The package seal ring 420 may have a width (e.g., thickness) of at least 0.1 µm, such as a width ranging from 0.15 µm to 100 µm, or from 0.2 µm to 50 µm.

Figure 6B:
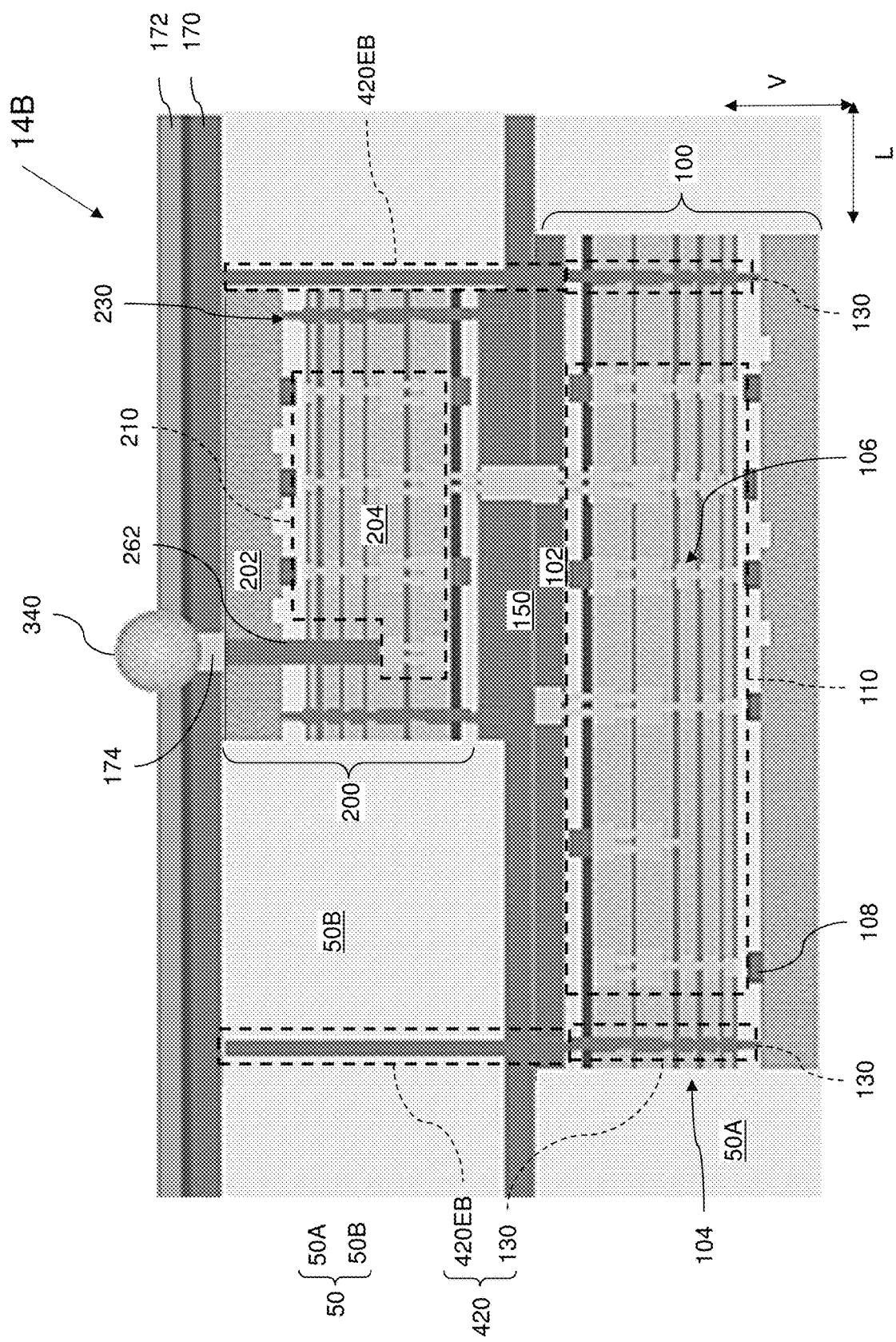
FIG. 6B is a cross-sectional view taken along line I-I' of FIG. 5, an eighth fourth example of a semiconductor package, according to various embodiments of the present disclosure.

FIG. 6B is a cross-sectional view taken along line I-I' of FIG. 5, of a semiconductor package 14B according to various embodiments of the present disclosure. The semiconductor package 14B may be similar to the semiconductor package 12A of FIG. 4A. As such, only the differences there between will be described in detail.

Referring to FIG. 6B, at least on second die 200 may be face-to-face bonded with the first die 100. In addition, the DE structure 50 that includes a first DE layer 50A that encapsulates the first die 100, and a second DE layer 50B that encapsulates the second die 200. The first DE layer 50A may be separated from the second DE layer 50B by a die bonding structure 150. A bonding layer 170 and a protective layer 172 may be disposed on the second DE layer 50B and the second die 200. An electrical contact 340 may be connected to a TSV structure 262 of the second die 200 by a bonding pad 174 disposed in the bonding layer 170.

The semiconductor package 14B may include the DE-bonding seal ring 420EB, which extends through the second DE layer 50B and the bonding structure 150. The DE-bonding seal ring 420EB may overlap with the first seal ring 130 in the lateral direction L and may directly contact the first seal ring 130. The DE-bonding seal ring 420EB may surround the second die 200 in the lateral direction L.

The DE-bonding seal ring 420EB and the first seal ring 130 may collectively form the package seal ring 420. The package seal ring 420 (e.g., the DE-bonding seal ring 420EB and the first seal ring 130) may be formed of a metal or metal alloy, such as Cu, TaN, Al, TiW, combinations thereof, or the like. The package seal ring 420 may have a width (e.g., thickness) of at least 0.1 µm, such as a width ranging from 0.15 µm to 100 µm, or from 0.2 µm to 50 µm.

Figure 6C:
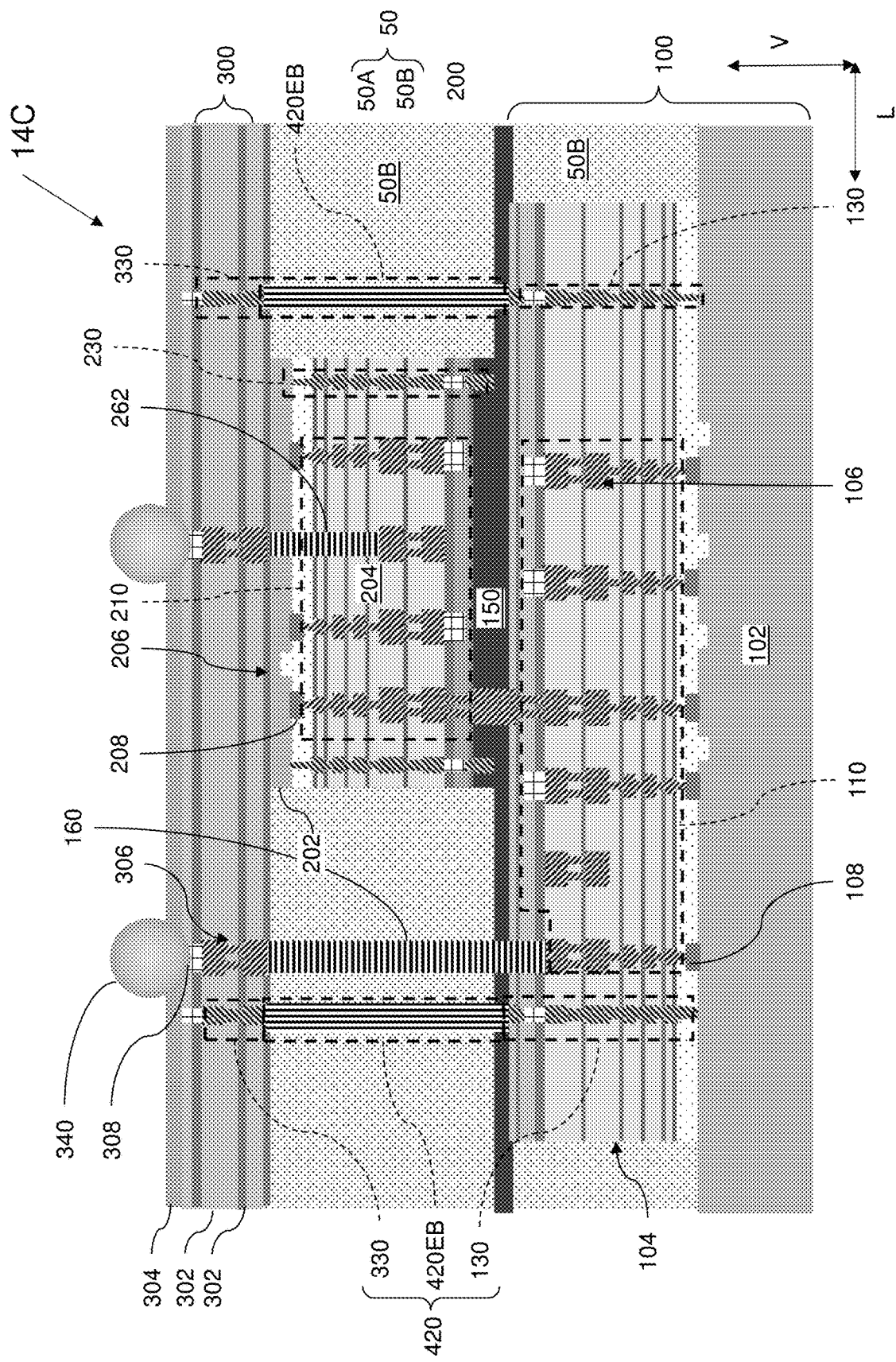
FIG. 6C is a cross-sectional view taken along line I-I' of FIG. 5, of a tenth example of a semiconductor package, according to various embodiments of the present disclosure.

FIG. 6C is a cross-sectional view taken along line I-I' of FIG. 5, of a semiconductor package 14C according to various embodiments of the present disclosure. The semiconductor package 14C may be similar to the semiconductor package 14C of FIG. 6B. As such, only the differences there between will be described in detail.

Referring to FIG. 6C, in the semiconductor package 14C, the second die 200 may be face-to-face bonded with the first die 100. In addition, the DE structure 50 that includes a first DE layer 50A that encapsulates the first die 100, and a second DE layer 50B that encapsulates the second die 200. The first DE layer 50A may be separated from the second DE layer 50B by a die bonding structure 150.

The semiconductor package 14C may include a redistribution layer structure 300 including a third seal ring 330, a TDV structure 160, and the DE-bonding seal ring 420EB. The DE-bonding seal ring 420EB may directly contact the first seal ring 130 and the third seal ring 330. The DE-bonding seal ring 420EB may surround the second die 200 and the TDV structure 160, in the lateral direction L.

The DE-bonding seal ring 420EB, the first seal ring 130, and the third seal ring 330 may collectively form the package seal ring 420. The package seal ring 420 (e.g., the DE-bonding seal ring 420EB, the first seal ring 130, and the third seal ring 330) may be formed of a metal or metal alloy, such as Cu, TaN, Al, TiW, combinations thereof, or the like. The package seal ring 420 may have a width (e.g., thickness)

of at least 0.1 µm, such as a width ranging from 0.15 µm to 100 µm, or from 0.2 µm to 50 µm.

Figure 7:
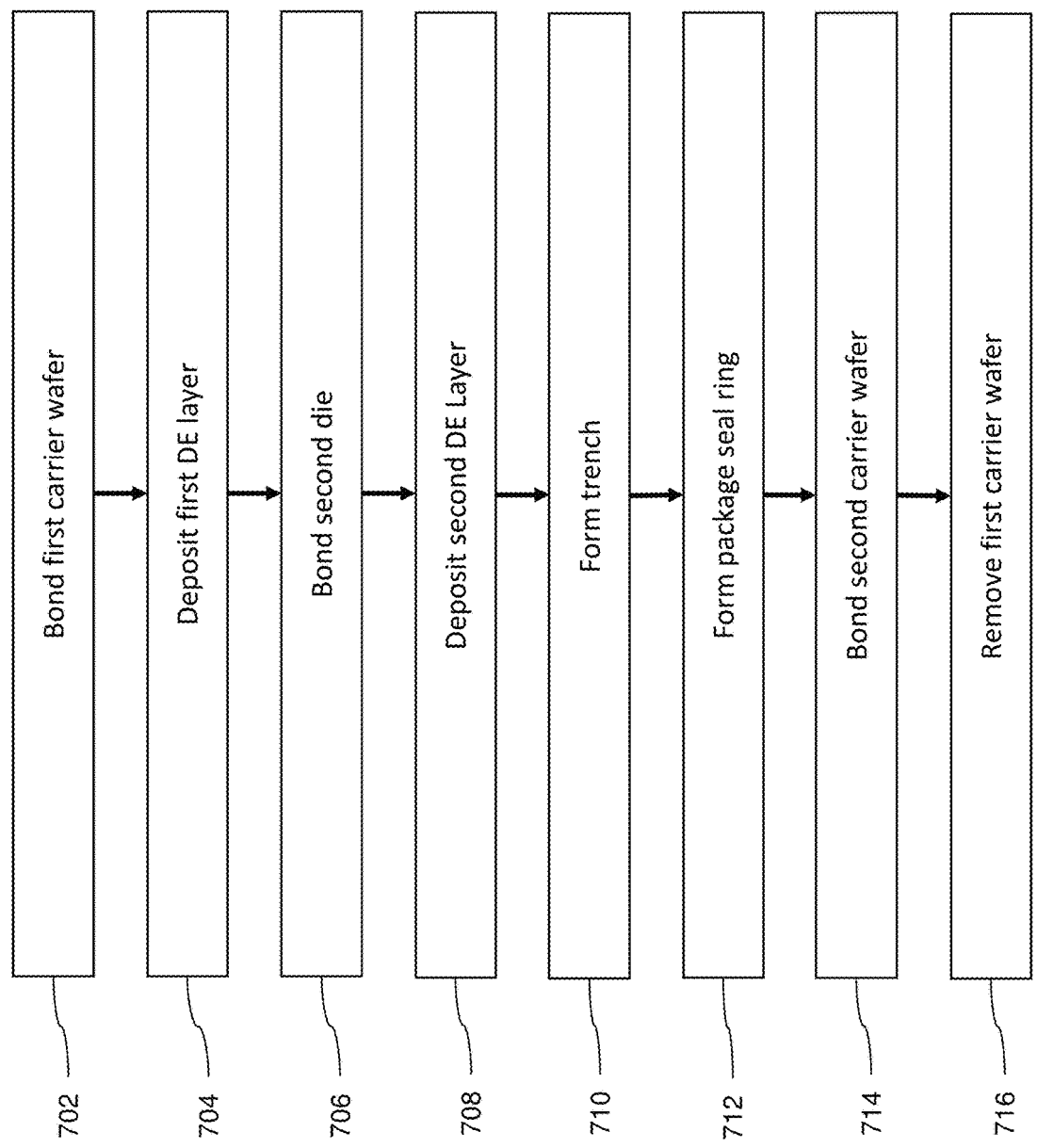
FIG. 7 is a flow chart illustrating a method of forming a semiconductor package, according to various embodiments of the present disclosure.

FIG. 7 is a flow chart illustrating a method of forming a semiconductor package, according to various embodiments of the present disclosure, such as the semiconductor package 10A of FIG. 2A. FIGS. 8A-8H are cross-sectional views illustrating operations of the method of FIG. 7.

Figure 8A:
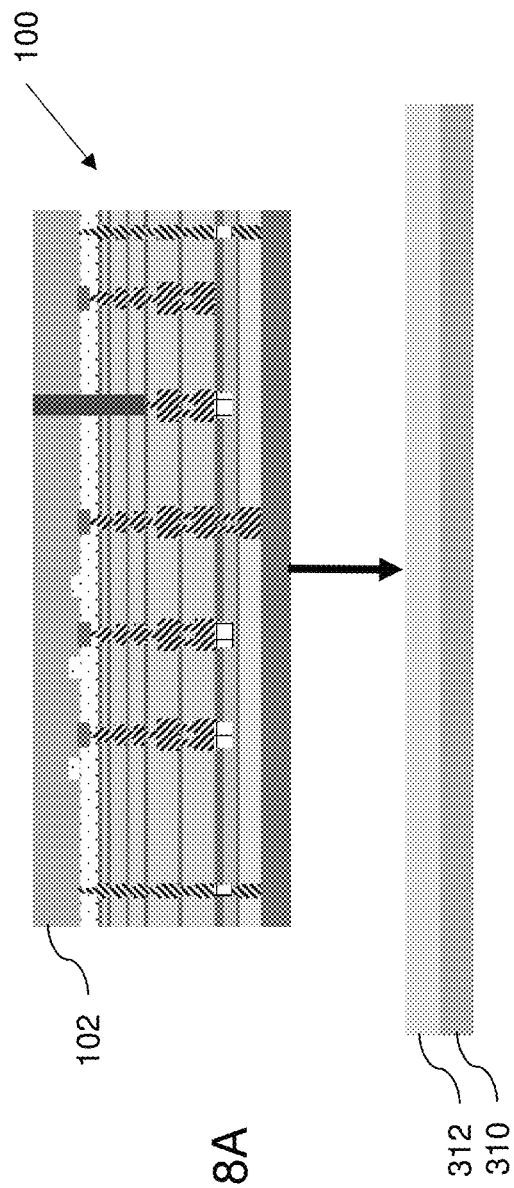
FIGS. 8A-8H are cross-sectional views illustrating operations of the method of FIG. 7.

Referring to FIGS. 7 and 8A, in operation 702 a first die 100 may be bonded to a first carrier 310. In particular, the first die 100 may be singulated, inverted, and bonded to a first carrier bonding layer 312 disposed on the first carrier 310, such that a first semiconductor substrate 102 of the first die 100 faces the first carrier 310. The first carrier 310 may be a carrier wafer or the like. Any suitable bonding process may be used, such as a thermal and/or chemical bonding process.

Figure 8B:
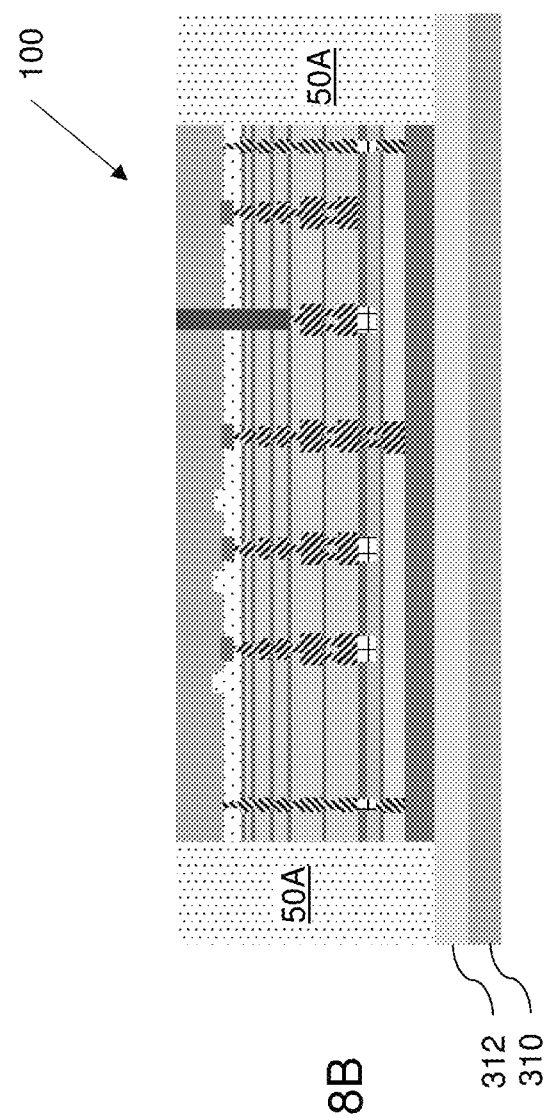

Referring to FIGS. 7 and 8B, in operation 704 a first DE layer 50A may be deposited on the first carrier bonding layer 312, around the first die 200. In some embodiments, the first DE layer 50A includes a molding compound. The molding compound may include a resin and a filler. In alternative embodiments, the first DE layer 50A may include silicon oxide, silicon nitride, a combination thereof, or the like. The first DE layer 50A may be deposited by spin-coating, lamination, deposition, or the like.

Figure 8C:
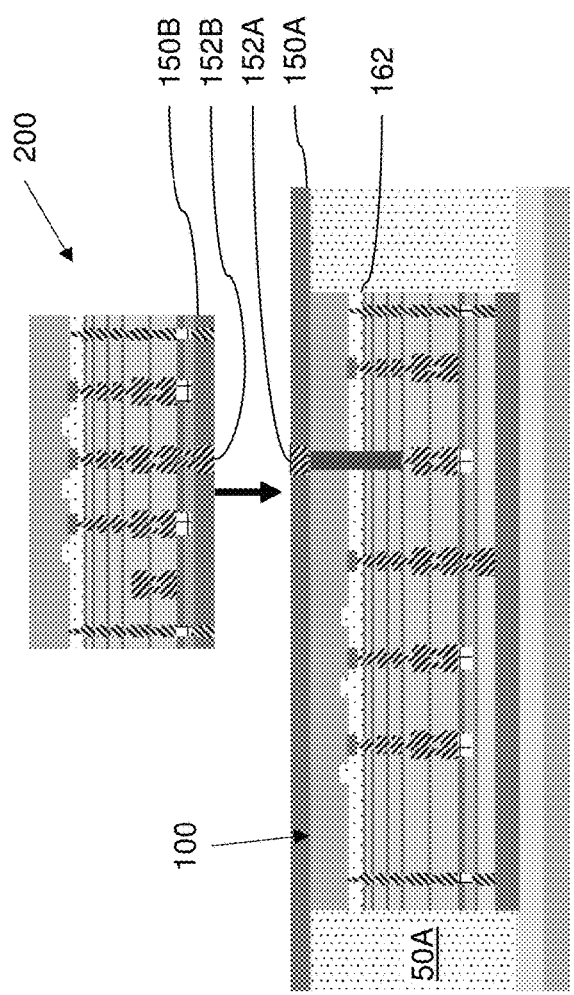

Referring to FIGS. 7 and 8C, in operation 706, at least one second die 200 may be bonded to the first die 100. In particular, a first bonding layer 150A may be deposited on the first die 100 and the first DE layer 50A. A second bonding layer 150B may be formed on the second die 200. The first bonding layer 150A may include metal first bonding features 152A, and the second bonding layer 150B may include metal second bonding features 152B.

For example, the first and second bonding layers 150A, 150B may be formed of binding polymers, such as an epoxy, a polyimide (PI), a benzocyclobutene (BCB), or a polybenzoxazole (PBO). In some embodiments, the first and second bonding layers 150A, 150B may be formed of the same bonding polymer. In other embodiments, the first and second bonding layers 150A, 150B may be formed of different bonding polymers, provided that the bonding polymers have sufficient adhesion to one another.

The first and second bonding features 152A, 152B may be formed of a metal such as such as gold (Au), copper (Cu), aluminum (Al), or alloys thereof, such as a copper tin alloy, a copper tantalum (Ta) alloy. However, other suitable materials may be utilized.

The second die 200 may be inverted, aligned with the first die 100, and bonded to the first die 100. In particular, the first bonding features 152A may be aligned with the second bonding features 152B. The bonding process may be a hybrid bonding process configured to form a bonding structure 150 by bonding the first and second bonding layers 150A, 150B, and to form die bonding pads 152 by bonding the first and second bonding features 152A, 152B (see FIG. 8D). In some embodiments, multiple second dies 200 may be bonded to the first die 100, during the bonding process.

Figure 8D:
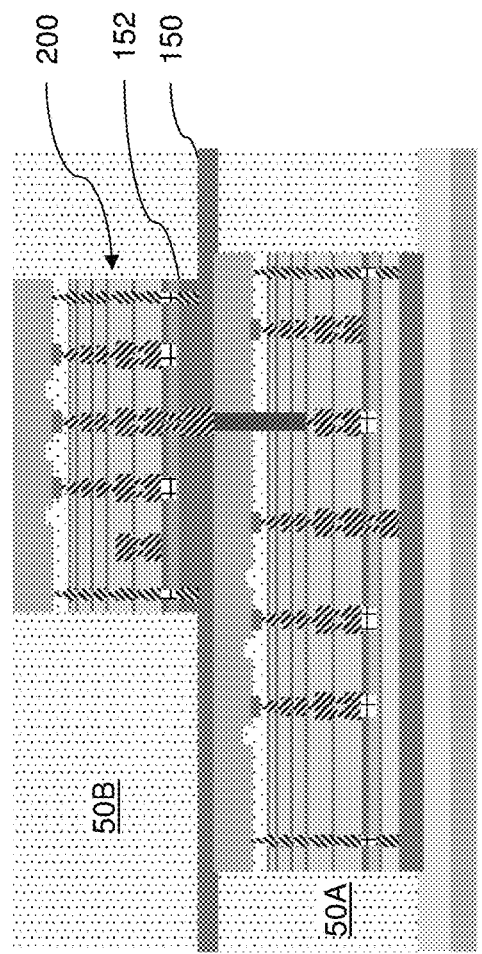

Referring to FIGS. 7 and 8D, in operation 708 a second DE layer 50B may be deposited on the bonding structure 150 and around the second die 200. The second DE layer 50B may be formed of the same material and/or using the same deposition process, as the first DE layer 50A.

Figure 8E:
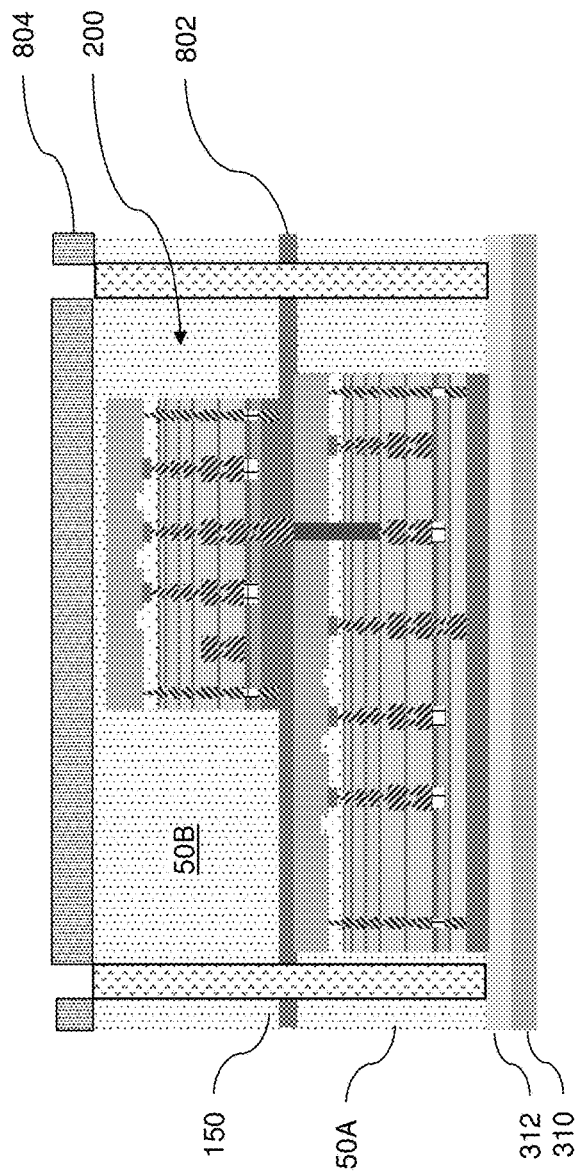

Referring to FIGS. 7 and 8E, in operation 710 a trench 802 may be formed that extends through the second DE layer 50B, the bonding structure 150, and the first DE layer 50A. In some embodiments, the trench 802 may expose the first carrier bonding layer 312.

In particular, a photoresist material may be deposited on the second die 200 and the second DE layer 50B. The photoresist material may be exposed and patterned to form a patterned photoresist layer 804 that exposes portions of the second DE layer 50B. A wet or dry etching process may then be performed, using the photoresist layer 804 as a mask, to form the trench 802. In some embodiments, the trench 802 may be vertically tapered, such that the bottom of the trench 802 may be wider than the top of the trench 802.

Figure 8F:
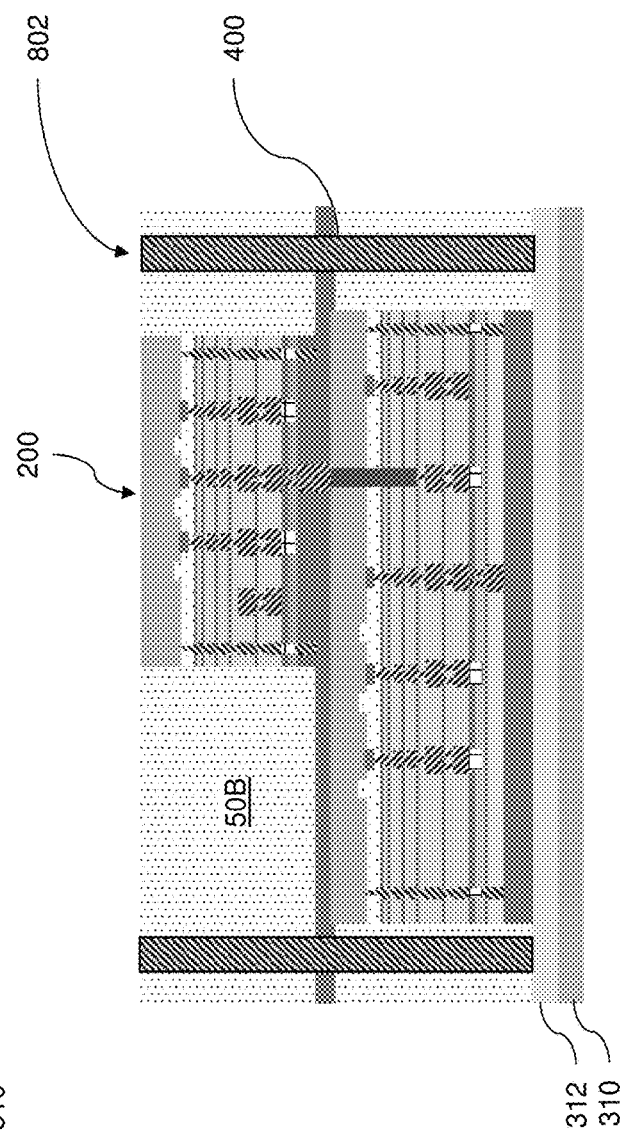

Referring to FIGS. 7 and 8F, in operation 712 the photoresist layer 804 may be stripped, by ashing for example, and a package seal ring 400 may be formed in the trench 802. In particular, the package seal ring 400 may be formed by depositing a seal ring material, such as Cu, Al, TaN, combinations thereof, or the like, using any suitable deposition process, such as electrochemical plating or the like. In some embodiments, a barrier layer (e.g., Ta/TaN barrier layer) may be formed in the trench 802, a copper seed layer may be deposited on the barrier layer using, for example, plasma vapor deposition of the like, and the DE-bonding seal ring 410DB may be grown on the seed layer using electroplating, of the like.

After the deposition process, any residual seal ring material may be removed from the upper surface of the second DE layer 50B and the upper surface second die 200, using a planarization process, such as chemical-mechanical planarization (CMP) or the like.

Figure 8G:
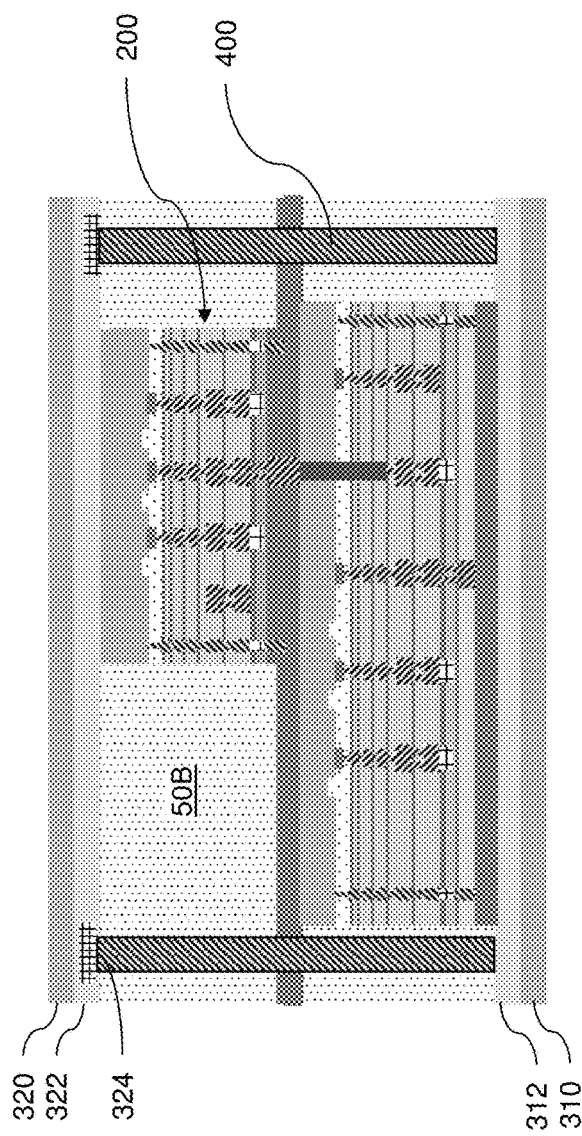

Referring to FIGS. 7 and 8G, in operation 714 a second carrier 320, such as a carrier wafer or the like, may be bonded to the second die 200 and the second DE layer 50B. In particular, the second carrier 320 may be bonded to a backside of the second die 200 and the second DE layer 50B using a second carrier bonding layer 322 bonded to the second carrier 320. The second carrier 320 may be aligned with the package seal ring 400 using alignment marks formed in the second carrier bonding layer 322.

Figure 8H:
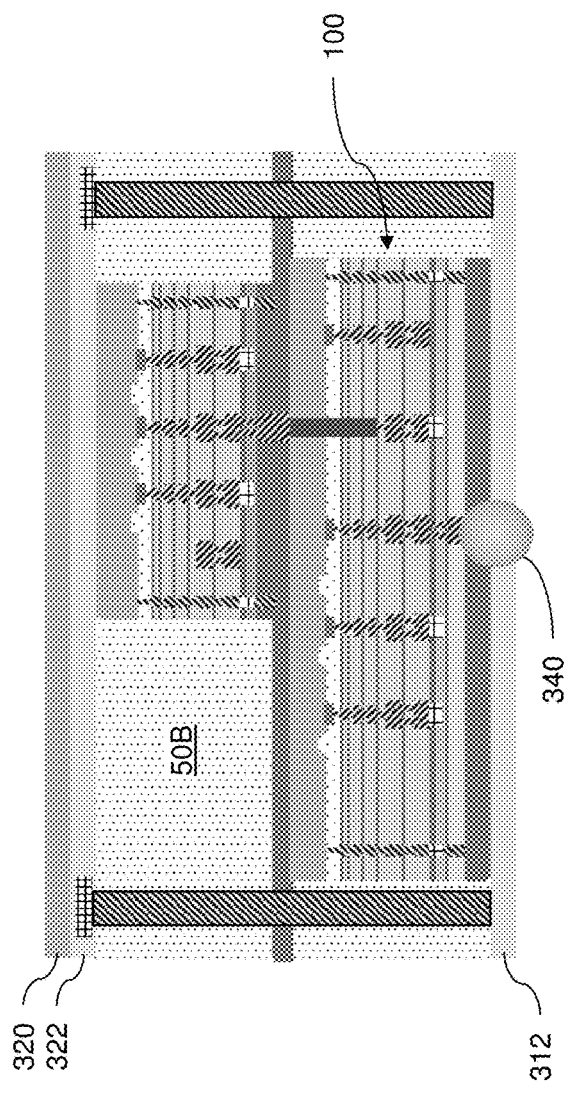

Referring to FIGS. 7 and 8H, in operation 716, the first carrier 310 may be removed from the first carrier bonding layer 312, and an electrical contact 340 may be electrically connected to the first die 100, thereby completing a semiconductor package.

Figure 9:
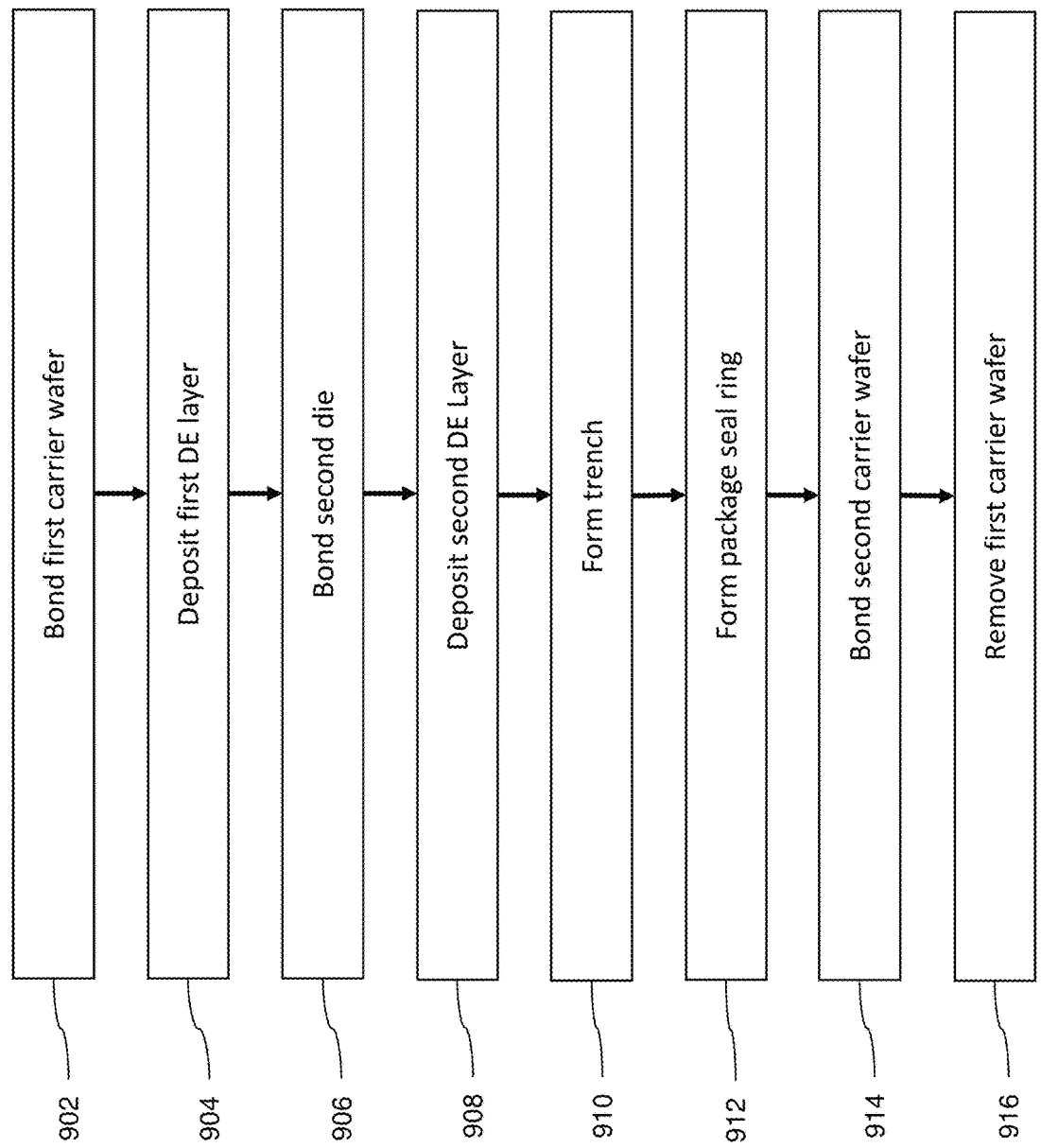
FIG. 9 is a flow chart illustrating a method of forming a semiconductor package, according to various embodiments of the present disclosure.

FIG. 9 is a flow chart illustrating a method of forming a semiconductor package, according to various embodiments of the present disclosure, such as the semiconductor package 12C of FIG. 4C. FIGS. 10A-10H are cross-sectional views illustrating operations of the method of FIG. 9.

Referring to FIGS. 9 and 10A, in operation 902 a first die 100 may be bonded to a first carrier 310. In particular, the first die 100 may be singulated, inverted, and bonded to a first carrier bonding layer 312 disposed on the first carrier 310, such that a first semiconductor substrate 102 of the first die 100 faces the first carrier 310. The first carrier 310 may be a carrier wafer or the like. Any suitable bonding process may be used, such as a thermal and/or chemical bonding process. The first die 100 may include a metal features seal ring 410M and a substrate-dielectric seal ring 410SD connected thereto.

Referring to FIGS. 9 and 10B, in operation 904 a first DE layer 50A may be deposited on the first carrier bonding layer 312, around the first die 200. In some embodiments, the first DE layer 50A includes a molding compound. The molding compound may include a resin and a filler. In alternative embodiments, the first DE layer 50A may include silicon oxide, silicon nitride, a combination thereof, or the like. The first DE layer 50A may be deposited by spin-coating, lamination, deposition, or the like.

Referring to FIGS. 9 and 10C, in operation 906, at least one second die 200 may be bonded to the first die 100. In particular, a first bonding layer 150A may be deposited on the first die 100 and the first DE layer 50A. A second bonding layer 150B may be deposited on the second die 200. The first bonding layer 150A may include metal first bonding features 152A, and the second bonding layer 150B may include metal second bonding features 152B. For example, the first and second bonding layers 150A, 150B may be formed of binding polymers, such as an epoxy, a polyimide (PI), a benzocyclobutene (BCB), a polybenzoxazole (PBO), or the like.

In some embodiments, the first and second bonding layers 150A, 150B may be formed of the same bonding polymer. In other embodiments, the first and second bonding layers 150A, 150B may be formed of different bonding polymers, provided that the bonding polymers have sufficient adhesion to one another.

The first and second bonding features 152A, 152B may be formed of a metal such as such as gold (Au), Cu, Al, or alloys thereof, such as a copper tin alloy, a copper tantalum (Ta) alloy, or a combination thereof. However, other suitable materials may be utilized.

The second die 200 may be inverted, aligned with the first die 100, and bonded to the first die 100. In particular, the first bonding features 152A may be aligned with the second bonding features 152B. The bonding process may be a hybrid bonding process configured to form a bonding structure 150 by bonding the first and second bonding layers 150A, 150B, and to form die bonding pads 152 by bonding the first and second bonding features 152A, 152B (see FIG. 10D). In some embodiments, multiple second dies 200 may be bonded to the first die 100, during the bonding process.

Referring to FIGS. 9 and 10D, in operation 908 a second DE layer 50B may be deposited on the bonding structure 150 and around the second die 200. The second DE layer 50B may be formed of the same material and/or using the same deposition process, as the first DE layer 50A.

Figure 10E:
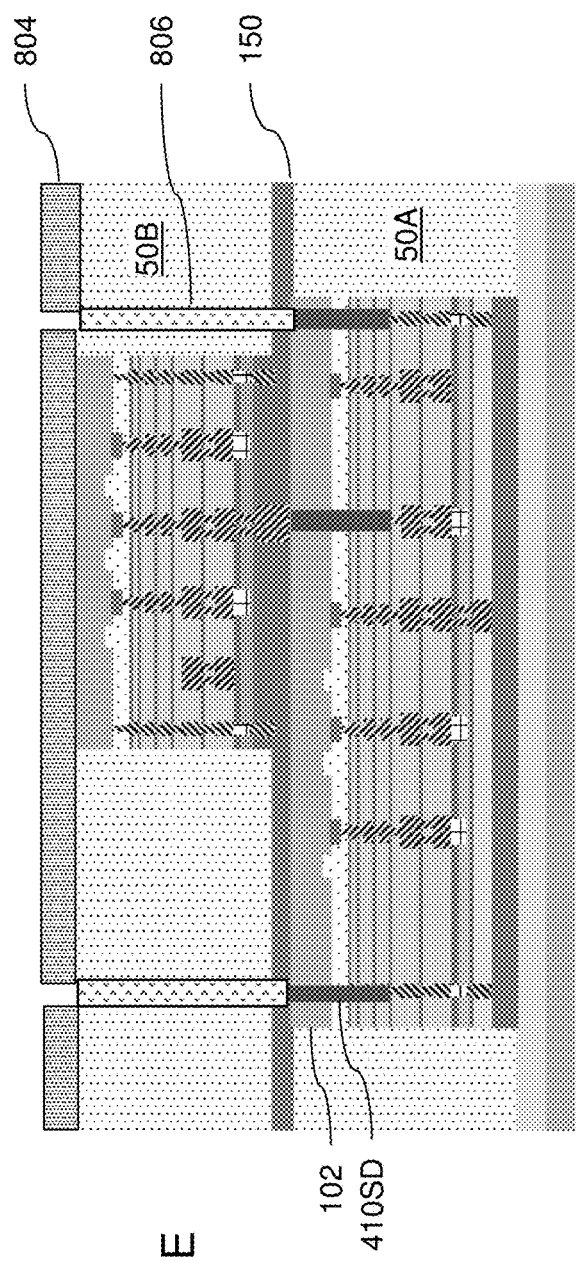

Referring to FIGS. 9 and 10E, in operation 910 a trench 806 may be formed that extends through the second DE layer 50B and the bonding structure 150 and exposes the first semiconductor substrate 102. The trench 806 may expose the substrate-dielectric seal ring 410SD on the back surface of the first semiconductor substrate 102.

In particular, a photoresist material may be deposited on the second die 200 and the second DE layer 50B. The photoresist material may be exposed and patterned to form a patterned photoresist layer 804 that exposes portions of the second DE layer 50B. A wet or dry etching process, such as a reactive ion etching process or the like, may then be performed, using the photoresist layer 804 as a mask, to form the trench 806. In some embodiments, the trench 806 may be vertically tapered (e.g., the sidewalls of the trench 806 may not be vertical). For example, the bottom of the trench 806 may be wider than the top of the trench 806. In other embodiments, the top of the trench 806 may be wider than the bottom of the trench 806. The degree of taper of the sidewalls may vary depending on the processing conditions and aspect ratio of the trench 806.

Figure 10F:
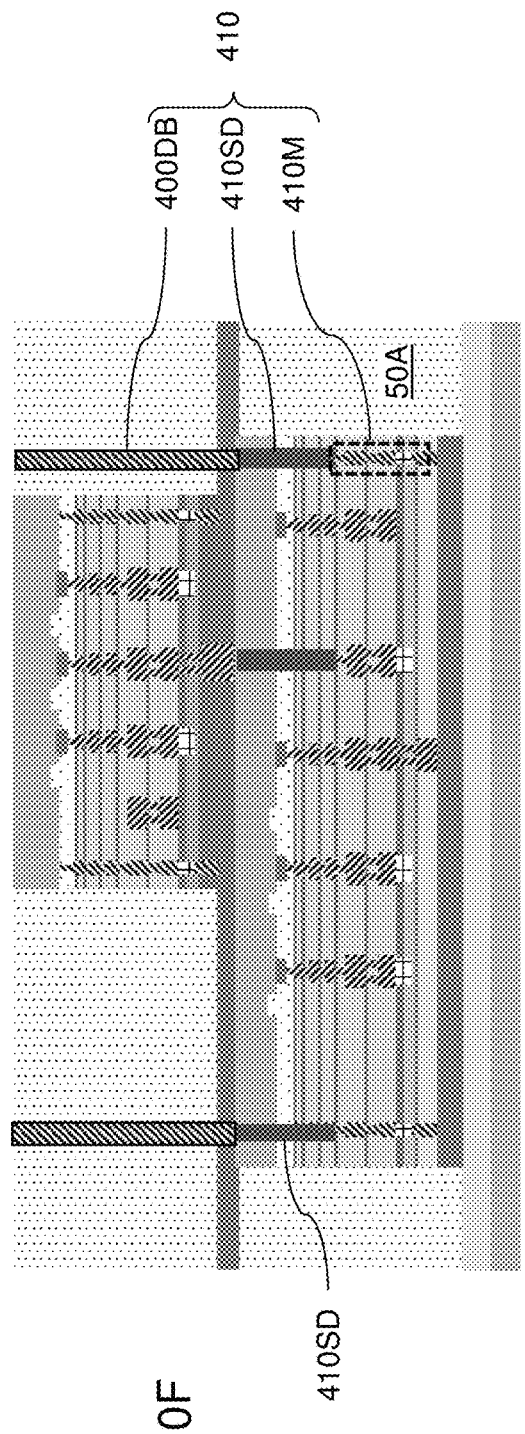

Referring to FIGS. 9 and 10F, in operation 912 the photoresist layer 804 may be stripped, by ashing for example, and a DE-bonding seal ring 410DB may be formed in the trench 806. In particular, the DE-bonding seal ring 410DB may be formed by depositing a seal ring material, such as Cu, Al, TaN, combinations thereof, or the like, using any suitable deposition process, such as electrochemical plating or the like. In some embodiments, a barrier layer (e.g., Ta/TaN barrier layer) may be formed in the trench 806, a copper seed layer may be deposited on the barrier layer using, for example, plasma vapor deposition of the like, and the DE-bonding seal ring 410DB may be grown on the seed layer using electroplating or the like.

The DE-bonding seal ring 410DB may contact the substrate-dielectric seal ring 410SD, which may contact the metal features seal ring 410M, thereby forming a package seal ring 410. After the deposition process, any residual seal ring material may be removed from the upper surface of the second DE layer 50B and the upper surface second die 200, using a planarization process, such as chemical-mechanical planarization (CMP) or the like.

Referring to FIGS. 9 and 10G, in operation 914 a second carrier 320, such as a carrier wafer or the like, may be bonded to the second die 200 and the second DE layer 50B. In particular, the second carrier 320 may be bonded to a backside of the second die 200 and the second DE layer 50B using a second carrier bonding layer 322. The second carrier 320 may be aligned with the package seal ring 400 using alignment marks formed in the second carrier bonding layer 322.

Referring to FIGS. 9 and 10H, in operation 916, the first carrier 310 may be removed from the first carrier bonding layer 312, and an electrical contact 340 may be electrically connected to the first die 100, thereby completing a semiconductor package.

Various embodiments provide a semiconductor package that may include: a first die 100; a second die 200 stacked on the first die 100 in a vertical direction; a dielectric encapsulation (DE) structure 50 surrounding the first die 100 and the second die 200 in a lateral direction perpendicular to the vertical direction; and a package seal ring 400 that extends through the DE structure 50 and surrounds the second die 200 and at least a portion of the first die 100, in the lateral direction.

In one embodiment, the semiconductor package may further include a bonding structure 150 bonding the first die 100 to the second die 200, wherein the package seal ring 400 extends through the bonding structure 150 to seal at least a portion of the bonding structure 150.

In one embodiment of the semiconductor package, the first die 100 and the second die 200 may be face-to-face bonded; a first die 100 may include a first semiconductor substrate 102, a first dielectric structure 104 disposed on the first semiconductor substrate 102, a first metal interconnect structure 110 disposed in the first dielectric structure 104, and a first seal ring 130 disposed in the first dielectric structure 104 and surrounding the first metal interconnect structure 110, in the lateral direction; and the package seal ring 400 may surround the first metal interconnect structure 110 in the lateral direction and penetrates the first semiconductor substrate 102 in the vertical direction.

In one embodiment of the semiconductor package, a portion of the DE structure 50 may be disposed between the package seal ring 400 and the first dielectric structure 104; and a portion of the DE structure 50 is disposed between the package seal ring 400 and the second die 200.

In one embodiment of the semiconductor package, the first die 100 and the second die 200 may be face-to-back bonded; and the package seal ring 400 may completely surround the first die 100.

In one embodiment, the semiconductor package may include a redistribution layer 300 disposed on the second die 200 and the DE structure 50 and comprising a third seal ring 330, wherein the package seal ring 400 surrounds the third seal ring 330 in the lateral direction.

In one embodiment, the semiconductor package may include multiple second dies 200, 200', 200" stacked on the first die 100; and the package seal ring 400 may surround the second dies 200, 200', 200" in the lateral direction.

In one embodiment of the semiconductor package, the package seal ring 400 may be electrically grounded and may have a thickness of at least 1 micron in the lateral direction.

Various embodiments provide a semiconductor package that may include: a first die 100; a second die 200 stacked on the first die 100 in a vertical direction; a dielectric encapsulation (DE) structure 50 surrounding the first die 100 and the second die 200 in a lateral direction perpendicular to the vertical direction; and a package seal ring 410 that extends through the first die 100, into the DE structure 50, and surrounds the second die 200 in the lateral direction.

In one embodiment, the semiconductor package may include a bonding structure 150 bonding an upper surface of the first die 100 to a lower surface of the second die 200, wherein the package seal ring 410 extends through the bonding structure 150.

In one embodiment of the semiconductor package the package seal ring 410 may be spaced apart from the first die 100 in the lateral direction by a portion of the DE structure 50; and the package seal ring 410 is disposed between a first seal ring 130 of the first die 100 and a perimeter of the first die 100, in the lateral direction.

In one embodiment of the semiconductor package the first die 100 and the second die 200 may be face-to-face bonded; the first die 100 may include a first semiconductor substrate 102, a first dielectric structure 104 disposed on the first semiconductor substrate 102, a first metal interconnect structure 110 disposed in the first dielectric structure 104, and a first seal ring 130 disposed in the first dielectric structure 104 and surrounding the first metal interconnect structure 110, in the lateral direction; and the package seal ring 410 may surround the first metal interconnect structure 110 in the lateral direction and contacts the first semiconductor substrate 102.

In one embodiment of the semiconductor package, the first die 100 and the second die 200 may be back-to-face bonded; the first die 100 may include a first semiconductor substrate 102, a first dielectric structure 104 disposed on the first semiconductor substrate 102, a first metal interconnect structure 150 disposed in the first dielectric structure 104, and a first seal ring 130 disposed in the first dielectric structure 104 and surrounding the first metal interconnect structure 110, in the lateral direction; and the package seal ring 410 may surround the first metal interconnect structure 110 in the lateral direction and extends through the first semiconductor substrate 102.

In one embodiment of the semiconductor package, the package seal ring 410 may include: a metal features seal ring 410M that surrounds a portion of the first seal ring 130; a substrate-dielectric seal ring 410SD that extends from the metal features seal ring 410M, through the first dielectric structure 104 and the first semiconductor substrate 102; and a DE-bonding seal ring 410EB that extends from the substrate-dielectric seal ring 410SD, through the bonding structure 150 and the DE structure 50.

Various embodiments provide a semiconductor package comprising: a first die 100 comprising a first semiconductor substrate 102, a first dielectric structure 104 disposed on the first semiconductor substrate, a first metal interconnect structure 110 disposed in the first dielectric structure 104, and a first seal ring 130 disposed in the first dielectric structure 104 and surrounding the first metal interconnect structure 110, in a lateral direction; a second die 200 stacked on the first die 100 in a vertical direction perpendicular to the lateral direction; a bonding structure 150 bonding the first die 100 to the second die 200; a dielectric encapsulation (DE) structure 50 surrounding the first die 100 and the second die 200 in a lateral direction perpendicular to the vertical direction; and a package seal ring 420 that extends through the DE structure 50 and the bonding structure 150, surrounds the second die 200 in the lateral direction, and overlaps with the first seal ring 130 in the lateral direction.

In one embodiment of the semiconductor package, the first die 100 and the second die 200 may be face-to-face bonded; the second die 200 may include a second seal ring 230; the semiconductor package may further include a redistribution layer 300 disposed on the second die 200 and comprising a third seal ring 330; and the package seal ring 420 may extend from the first seal ring 130 to the third seal ring 330.

In one embodiment of the semiconductor package, the first die 100 and the second die 200 are back-to-face bonded; and the package seal ring 420 may penetrate the first semiconductor substrate 102 and is separated from the first seal ring 130 by a portion of the first semiconductor substrate 102P.

In one embodiment of the semiconductor package, the first die 100 and the second die 200 may be back-to-face bonded; and the package seal ring 420 may extend through the first semiconductor substrate 102 and contacts the first seal ring 130.

In one embodiment of the semiconductor package, the package seal ring 420 may be separated from the second die 200 by a portion of the DE structure 50.

In one embodiment of the semiconductor package, the package seal ring 420 may be electrically grounded and has a thickness of at least 1 micron in the lateral direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
    a first die;
    a second die stacked on the first die in a vertical direction;
    a dielectric encapsulation (DE) structure surrounding the first die and the second die in a lateral direction perpendicular to the vertical direction; and
    a package seal ring that extends through the DE structure and surrounds the second die and at least a portion of the first die, in the lateral direction.

2. The semiconductor package of claim 1, further comprising a bonding structure bonding the first die to the second die,
    wherein the package seal ring extends through the bonding structure to seal at least a portion of the bonding structure.

3. The semiconductor package of claim 2, wherein:
    the first die and the second die are face-to-face bonded;
    a first die comprises a first semiconductor substrate, a first dielectric structure disposed on the first semiconductor substrate, a first metal interconnect structure disposed in the first dielectric structure, and a first seal ring disposed in the first dielectric structure and surrounding the first metal interconnect structure, in the lateral direction; and the package seal ring surrounds the first metal interconnect structure in the lateral direction and penetrates the first semiconductor substrate in the vertical direction.

4. The semiconductor package of claim 3, wherein:
a portion of the DE structure is disposed between the package seal ring and the first dielectric structure; and
a portion of the DE structure is disposed between the package seal ring and the second die.

5. The semiconductor package of claim 2, wherein:
the first die and the second die are face-to-back bonded; and
the package seal ring completely surrounds the first die.

6. The semiconductor package of claim 1, further comprising a redistribution layer disposed on the second die and the DE structure and comprising a third seal ring,
wherein the package seal ring surrounds the third seal ring in the lateral direction.

7. The semiconductor package of claim 1, wherein:
the semiconductor package comprises multiple second dies stacked on the first die; and
the package seal ring surrounds the second dies in the lateral direction.

8. The semiconductor package of claim 1, wherein the package seal ring is electrically grounded and has a thickness of at least 1 micron in the lateral direction.

9. A semiconductor package comprising:
a first die;
a second die stacked on the first die in a vertical direction;
a dielectric encapsulation (DE) structure surrounding the first die and the second die in a lateral direction perpendicular to the vertical direction; and
a package seal ring that extends through the first die, into the DE structure, and surrounds the second die in the lateral direction.

10. The semiconductor package of claim 9, further comprising a bonding structure bonding an upper surface of the first die to a lower surface of the second die,
wherein the package seal ring extends through the bonding structure.

11. The semiconductor package of claim 10, wherein:
the package seal ring is spaced apart from the first die in the lateral direction by a portion of the DE structure; and
the package seal ring is disposed between a first seal ring of the first die and a perimeter of the first die, in the lateral direction.

12. The semiconductor package of claim 10, wherein:
the first die and the second die are face-to-face bonded;
the first die comprises a first semiconductor substrate, a first dielectric structure disposed on the first semiconductor substrate, a first metal interconnect structure disposed in the first dielectric structure, and a first seal ring disposed in the first dielectric structure and surrounding the first metal interconnect structure, in the lateral direction; and
the package seal ring surrounds the first metal interconnect structure in the lateral direction and contacts the first semiconductor substrate.

13. The semiconductor package of claim 10, wherein:
the first die and the second die are back-to-face bonded;
the first die comprises a first semiconductor substrate, a first dielectric structure disposed on the first semiconductor substrate, a first metal interconnect structure disposed in the first dielectric structure, and a first seal ring disposed in the first dielectric structure and surrounding the first metal interconnect structure, in the lateral direction; and
the package seal ring surrounds the first metal interconnect structure in the lateral direction and extends through the first semiconductor substrate.

14. The semiconductor package of claim 13, wherein the package seal ring comprises:
a metal features seal ring that surrounds a portion of the first seal ring;
a substrate-dielectric seal ring that extends from the metal features seal ring, through the first dielectric structure and the first semiconductor substrate; and
a DE-bonding seal ring that extends from the substrate-dielectric seal ring, through the bonding structure and the DE structure.

15. A semiconductor package comprising:
a first die comprising a first semiconductor substrate, a first dielectric structure disposed on the first semiconductor substrate, a metal interconnect structure disposed in the first dielectric structure, and a first seal ring disposed in the first dielectric structure and surrounding the first metal interconnect structure, in a lateral direction;
a second die stacked on the first die in a vertical direction perpendicular to the lateral direction;
a bonding structure bonding the first die to the second die;
a dielectric encapsulation (DE) structure surrounding the first die and the second die in a lateral direction perpendicular to the vertical direction; and
a package seal ring that extends through the first die, the DE structure, and the bonding structure, and surrounds the second die and the first seal ring in the lateral direction.

16. The semiconductor package of claim 15, wherein:
the first die and the second die are face-to-face bonded;
the second die comprises a second seal ring;
the semiconductor package further comprises a redistribution layer disposed on the second die and comprising a third seal ring; and
the package seal ring surrounds the third seal ring in the lateral direction.

17. The semiconductor package of claim 16, further comprising a through-dielectric via (TDV) structure that extends through the DE structure and the bonding structure to electrically connect the first metal interconnect structure to metal features of the redistribution layer.

18. The semiconductor package of claim 17, wherein the package seal ring laterally surrounds the metal features of the redistribution layer.

19. The semiconductor package of claim 15, wherein the package seal ring is separated from the second die by a portion of the DE structure.

20. The semiconductor package of claim 16, wherein the package seal ring comprises:
a dielectric structure seal ring that extends through the first dielectric structure and surrounds the first seal ring in the lateral direction; and
a DE-bonding seal ring that extends from the dielectric structure seal ring through the bonding structure, the DE structure, and the redistribution layer, and that surrounds the second die in the lateral direction.

* * * * *